United States Patent
Salerno et al.

(10) Patent No.: US 7,174,200 B2
(45) Date of Patent: Feb. 6, 2007

(54) OPTIMIZED HIGH-SPEED MAGNETIC RESONANCE IMAGING METHOD AND SYSTEM USING HYPERPOLARIZED NOBLE GASES

(75) Inventors: Michael Salerno, Palo Alto, CA (US); John P. Mugler, III, Charlottesville, VA (US); James R. Brookeman, Charlottesville, VA (US)

(73) Assignee: University of Virginia Patent Foundation, Charlottesville, VA (US)

( * ) Notice: Subject to any disclaimer, the term of this patent is extended or adjusted under 35 U.S.C. 154(b) by 645 days.

(21) Appl. No.: 10/474,571

(22) PCT Filed: Apr. 12, 2002

(86) PCT No.: PCT/US02/11746
§ 371 (c)(1),
(2), (4) Date: Oct. 14, 2003

(87) PCT Pub. No.: WO02/084305

PCT Pub. Date: Oct. 24, 2002

(65) Prior Publication Data
US 2004/0260173 A1 Dec. 23, 2004

Related U.S. Application Data

(60) Provisional application No. 60/283,918, filed on Apr. 13, 2001.

(51) Int. Cl.
B61B 5/05 (2006.01)
(52) U.S. Cl. .............. 600/420; 600/431; 600/407; 424/9.3
(58) Field of Classification Search .............. 600/420, 600/431, 407; 424/9.3
See application file for complete search history.

(56) References Cited

U.S. PATENT DOCUMENTS

| 5,545,396 | A | * | 8/1996 | Albert et al. | 424/9.3 |
| 5,617,859 | A | * | 4/1997 | Souza et al. | 600/420 |
| 5,694,934 | A | * | 12/1997 | Edelman | 600/410 |
| 2001/0031242 | A1 | * | 10/2001 | Cremillieux et al. | 424/9.36 |

* cited by examiner

Primary Examiner—Brian L. Casler
Assistant Examiner—Jacqueline Cheng
(74) Attorney, Agent, or Firm—Robert J. Decker

(57) ABSTRACT

A system and method for using hyperpolarized noble gases together with an appropriately designed and optimized magnetic resonance imaging pulse sequence to rapidly acquire static or dynamic magnetic resonance images. The strong magnetic resonance signal from hyperpolarized gases, combined with the present magnetic resonance imaging technique, presents the opportunity for the imaging of gases with both high spatial and high temporal resolution. One potential application for such a method is the direct, dynamic visualization of gas flow, which would be extremely useful for characterizing a variety of fluid systems. In the medical field, one such system of substantial importance is the lung. The system and method provides for visualizing regional ventilatory patterns throughout the respiratory cycle with high temporal and high spatial resolution. The low sensitivity to susceptibility artifacts permits good image quality to be obtained in various orientations. Depending on the application, temporal resolution can be traded for anatomical coverage. Such application of dynamic imaging of the lung using hyperpolarized gases will provide unique information on the physiology and pathophysiology of the lung, and has the potential for many clinically-relevant applications.

39 Claims, 7 Drawing Sheets

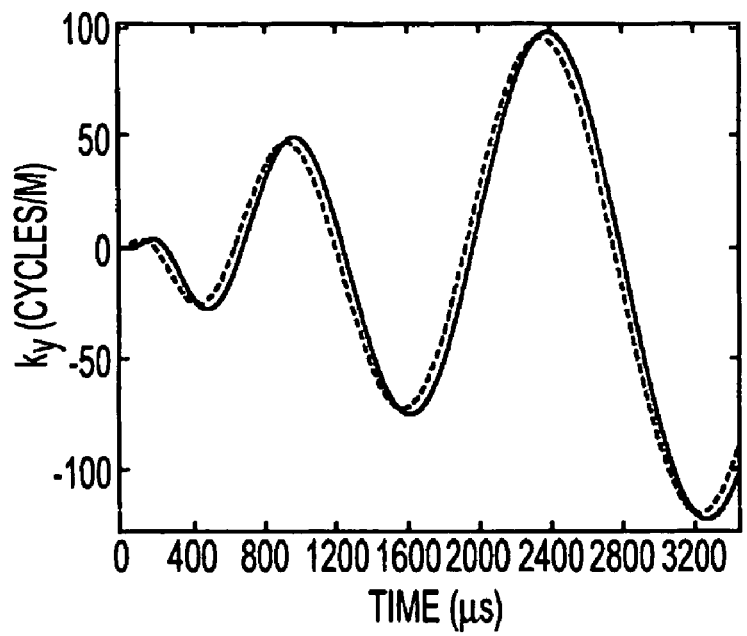
FIG. 1
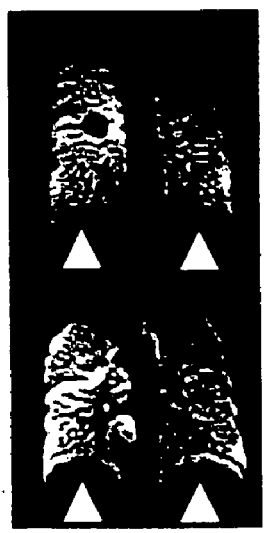   
FIG. 2A  FIG. 2B  FIG. 2C  FIG. 2D

OPTIMIZED HIGH-SPEED MAGNETIC RESONANCE IMAGING METHOD AND SYSTEM USING HYPERPOLARIZED NOBLE GASES

RELATED APPLICATIONS

This application is a national stage filing of International Application No. PCT/US02/11746, filed 12 Apr. 2002, which claims benefit under 35 U.S.C. Section 119(e) from U.S. Provisional Application Ser. No. 60/283,918 filed on Apr. 13, 2001, entitled "Optimized High-Speed Magnetic Resonance Imaging System Using Hyperpolarized Noble Gases and Related Method Thereof", the entire disclosures of which are hereby incorporated by reference herein in their entirety.

GOVERNMENT SUPPORT

Work described herein was supported by Federal Grant Number R44-HL059022, awarded by the National Institutes of Health. The United States Government possesses certain rights in and to this invention.

FIELD OF INVENTION

The present invention relates to a system and methodology for using hyperpolarized noble gases together with an appropriately designed and optimized magnetic resonance imaging pulse sequence to rapidly acquire static or dynamic magnetic resonance images.

BACKGROUND OF INVENTION

Nuclear magnetic resonance imaging (MRI) is an important modality for both clinical and basic-science imaging applications. A recent notable advance in MRI was the introduction of the "hyperpolarized" noble gases helium-3 ($^3$He) and xenon-129 ($^{129}$Xe) as novel magnetic-resonance contrast agents (See U.S. Pat. Nos. 5,545,396, 5,785,921, 5,785,953 and 6,123,919 to Albert et al.; and Albert M. S., Cates G. D., Driehuys B, et al., "*Biological Magnetic Resonance Imaging Using Laser-polarized $^{129}$Xe.*" Nature, 1994, 370:199–201, the contents of these patents and this publication are hereby incorporated by reference herein in their entirety). Nuclear polarization levels approaching 100% can be achieved using hyperpolarized noble gases. This dramatic increase in the polarization compared to that typically achieved at thermal equilibrium (at most $10^{-4}$) has presented the opportunity for many new MRI applications.

In particular, the strong MR signal from hyperpolarized gases, combined with an appropriate MRI technique, presents the opportunity for imaging of gases with both high spatial and high temporal resolution. One potential application for such a method is the direct, dynamic visualization of gas flow, which would be extremely useful for characterizing a variety of fluid systems. In the medical field, one such system of substantial importance is the lung.

Imaging the Gas-Flow Dynamics of the Lung

Static, high-resolution MR images of the lung air spaces have been demonstrated following the inhalation of hyperpolarized-$^3$He gas (See Middleton H., Black R. D., Saam B., et al., "*MR Imaging with Hyperpolarized He-3 gas*", Magn. Reson. Med., 1995, 33:271–275; Black R. D., Middleton H. L., Cates G. D., et al., "*In vivo He-3 MR Images of Guinea Pig Lungs.*"Radiology, 1996, 199:867–870; Kauczor H. U., Hofmann D., Kreitner K. F., et al., "*Normal and Abnormal Pulmonary Ventilation: Visualization at Hyperpolarized He-3 MR Imaging.*" Radiology, 1996, 201:564–568; and MacFall J. R., Charles H. C., Black R. D., et al., "*Human Lung Air Spaces: Potential for MR Imaging with Hyperpolarized He-3.*" Radiology, 1996, 200:553–558). Many initial investigations of the lung using hyperpolarized gases have concentrated on this static spin-density imaging, which is believed to directly reflect lung ventilation. These studies suggest that $^3$He "ventilation" imaging shows promise for differentiating healthy lungs from those with pathologies such as chronic obstructive pulmonary disease (See Kauczor H. U., Ebert M., Kreitner K. F., et al., "*Imaging of the Lungs Using $^3$He MRI: Preliminary Clinical Experience in 18 Patients with and without Lung Disease*", J. Magn. Reson. Imaging, 1997, 7:538–543; and de Lange E. E., Mugler III J. P., Brookeman J. R., et al., "*Lung Air Spaces: MR Imaging Evaluation with Hyperpolarized $^3$He Gas*", Radiology, 1999, 210:851–857), asthma (See Altes T. A., Powers P. L., Knight-Scott J., et al., "*Hyperpolarized $^3$He MR Lung Ventilation Imaging in Asthmatics: Preliminary Findings*", J. Magn. Reson. Imaging, 2001, 13:378–384 [herein after "Altes, Powers et al."]) and cystic fibrosis (See Donnelly L. F., MacFall J. R., McAdams H. P., et al., "*Cystic Fibrosis: Combined Hyperpolarized $^3$He-enhanced and Conventional Proton MR Imaging in the Lung—Preliminary Observations*", Radiology, 1999, 212:885–889). Nonetheless, to fully appreciate many aspects of lung physiology and pathophysiology, an understanding of the gas-flow dynamics during breathing is needed. An approach for obtaining this information is provided in this document.

In the context of lung imaging, some conventional research investigations have made progress toward developing methods for visualizing the time-dependent distribution of gas using hyperpolarized $^3$He or $^{129}$Xe (See Roberts T. P. L., Surkau R., Kauczor H. U., et al., "*Helium-3 MRI of Lung Ventilatory Function*", In: Proc. Intl. Soc. Magn. Reson. Med., 5th Meeting, 1997, 307 [herein after "Roberts, Surkau et al."]; Ruppert K., Brookeman J. R., Mugler III J. P., "*Real-time MR Imaging of Pulmonary Gas-Flow Dynamics with Hyperpolarized $^3$He*", In: Proc. Intl. Soc. Magn. Reson. Med., 6th Meeting, 1998, 1909 [herein after "Ruppert, Brookeman et al."]; Saam B., Yablonskiy D. A., Gierada D. S., Conradi M. S., "*Rapid Imaging of Hyperpolarized Gas Using EPI*", Magn. Reson. Med., 1999, 42:507–514 (herein after "Saam, Yablonskiy et al."); Chen X. J., Chawla M. S., Hedlund L. W., Möller H. E., MacFall J. R., Johnson G. A., "*MR Microscopy of lung Airways with Hyperpolarized $^3$He*", Magn. Reson. Med., 1998, 39:79–84 [herein after "Chen, Chawla et al."]; Viallon M., Berthezene Y., Callot V., et al., "*Dynamic Imaging of Hyperpolarized $^3$He Distribution in Rat Lungs Using Interleaved-Spiral Scans*", NMR Biomed, 2000, 13:207–213 [herein after "Viallon, Berthezene et al."]; Gierada D. S., Saam B., Yablonskiy D., Cooper J. D., Lefiak S. S., Conradi M. S., "*Dynamic Echo Planar MR Imaging of Lung Ventilation with Hyperpolarized $^3$He in Normal Subjects and Patients with Severe Emphysema*", NMR Biomed 2000, 13:176–181; Roberts D. A., Rizi R. R., Lipson D. A., et al., "*Detection and Localization of Pulmonary Air Leaks Using Laser-polarized $^3$He MRI*", Magn. Reson. Med., 2000, 44:379–382; and Schreiber W. G., Markstaller K., Kauczor H. U., et al., "Ultrafast Imaging of Lung Ventilation Using Hyperpolarized Helium-3", In: Proc. Intl. Soc. Magn. Reson. Med., 7th Meeting, 1999, 129 [herein after "Schreiber, Markstaller et al."]). However, all of these previous attempts have notable limitations, and none, nor any of their extensions, provide the means to visualize gas-flow dynamics with high spatial resolution, high temporal resolution, and negligible image artifacts.

Rapid conventional gradient-echo pulse sequences lack the desired temporal resolution. Furthermore, since the hyperpolarized magnetization is by nature in a non-equilibrium state, it is beneficial to minimize the number of radio-frequency (RF) pulses needed to create each image. Yet conventional gradient-echo imaging is undesirable in this respect as an RF pulse is required for each line of spatial-frequency-space (k-space) data.

In addition, as is well known from the development of dynamic methods for proton MRI, the rectilinear k-space trajectory used in gradient-echo pulse sequences is suboptimal for continuous (i.e., "fluoroscopic") depiction of a dynamic process since only a small number of the raw data lines are located near the center of k space.

For efficient use of the non-equilibrium, hyperpolarized magnetization, gradient-echo-based echo-planar imaging (EPI) is attractive since only one RF pulse per image is required. Saam, Yablonskiy et al. used EPI to acquire axial 1-cm thick dynamic images of the lung with a temporal frame rate of 40 ms and an in-plane spatial resolution of 6–7 mm. Although EPI provides efficient use of the magnetization and high temporal resolution, it is prone to signal loss and/or geometric distortion secondary to the effects of magnetic field inhomogeneities during the relatively long data-sampling period. In addition, the gradient-intensive nature of EPI makes it susceptible to diffusion-induced signal losses when gases are imaged. For example, when applied to lung imaging, attenuation of the MR signal—due to the relatively short T2* (~10 ms for $^3$He in the human lung at 1.5 T (See Chen X. J., Möller H. E., Chawla M. S., et al., "*Spatially Resolved Measurements of Hyperpolarized Gas Properties in the Lung In vivo. Part II: T2\**", Magn. Reson. Med., 1999, 42:729–737), and due to the high diffusion coefficient (~2 cm$^2$/s for pure $^3$He at STP) of the gas—limits the spatial resolution to be greater than approximately 5 mm.

Additionally, slice orientations other than axial demonstrate substantial bulk magnetic susceptibility-induced image distortions due to the structure of the lung, thus reducing the utility of the technique.

Furthermore, the EPI pulse-sequence structure requires an echo time that is on the order of the T2*, resulting in marked signal loss around vessels due to susceptibility effects (See Saam, Yablonskiy, et al.). An interleaved-EPI pulse sequence configuration (See Mugler III J. P., Brookeman J. R., Knight-Scott J., Maier T., de Lange E. E., Bogorad P. L., "*Interleaved Echo-Planar Imaging of the Lungs with Hyperpolarized $^3$He*", In: Proc. Intl. Soc. Magn. Reson. Med., 6th Meeting, 1998, 448) mitigates the susceptibility- and diffusion-induced limitations of EPI. However, an attempt at dynamic hyperpolarized-gas imaging using interleaved-EPI resulted in substantial motion artifacts during periods of rapid gas flow (See Ruppert, Brookeman et al.).

There is therefore a need for an optimal method and system that provides the information required to generate hyperpolarized noble gas images with high spatial and high temporal resolution, and with negligible image artifacts from motion and from field inhomogeneities, such as those caused by magnetic susceptibility interfaces. As no other method for studying the lung can provide both high spatial and high temporal resolution, the present invention provides, among other possibilities, an approach for dynamic imaging of ventilatory function with hyperpolarized gases that shall provide unique and medically relevant information.

Other Applications

Applications such as the measurement of the apparent diffusion coefficient of gas mixtures (See Chen X. J., Moller H. E., Chawla M. S., et al., "*Spatially Resolved Measurements of Hyperpolarized Gas Properties in the Lung In vivo. Part I: Diffusion Coefficient*," Magn. Reson. Med., 1999, 42:721–728.), or the determination of the oxygen concentration in gas mixtures (See Deninger A. J., Eberle B., Ebert M., et al., "*Quantification of Regional Intrapulmonary Oxygen Partial Pressure Evolution during Apnea by $^3$He MRI*", J. Magn. Reson., 1999, 141:207–216.), require the acquisition of several images at each spatial location (i.e., slice) of interest. However, the total acquisition time is generally limited, for example by the spin-lattice (T1) relaxation time of the hyperpolarized gas, or, for applications such as human lung imaging, by the subject's ability to suspend respiration. The acquisition time constraint, in turn, limits the number of slices that can be interrogated. Therefore, there is a need in the art for an appropriate high-speed technique that would provide the important benefit of allowing the spatial extent that can be probed per unit time to be substantially increased, as provided by the present invention techniques.

Additionally, there is a need in the art for a high-speed technique for hyperpolarized-gas MRI that permits high temporal resolution to be traded, if desired, for spatial coverage, as also provided by the present invention techniques. Such a technique would also be beneficial for certain other hyperpolarized-gas applications.

SUMMARY OF THE INVENTION

The present invention comprises the method, related system, and computer useable medium (readable media) for using hyperpolarized noble gases together with an appropriately designed and optimized MRI pulse sequence to yield a technique that: (1) generates images with high spatial resolution, high temporal resolution, and negligible image artifacts, and (2) permits, in appropriate applications, the high temporal resolution to be easily traded for increased spatial coverage.

It is therefore an object of the present invention to use hyperpolarized noble gases together with an appropriately designed and optimized MRI pulse sequence that provide all or some of the following features: (1) a small number of RF pulses per image, which use appropriately chosen flip angles, to provide efficient use of the non-equilibrium, hyperpolarized magnetization; (2) a k-space sampling strategy that is compatible with high-temporal-resolution, fluoroscopic depiction of dynamic processes; (3) a k-space sampling strategy that provides a low sensitivity to motion, thus yielding a low level of motion-induced artifacts; (4) a k-space sampling strategy that permits temporal resolution to be traded for spatial coverage without disrupting the fundamental structure of the pulse sequence; (5) encoding gradient waveforms that result in a low level of diffusion-induced signal attenuation; and (6) a data-sampling period per excitation that is matched to the level of magnetic field inhomogeneities for the particular application so as to yield negligible inhomogeneity-induced image artifacts.

An important advantage and application of the present invention is the visualization of gas-flow dynamics. Since the present invention method permits gas-flow patterns to be determined without the introduction of secondary tracer materials and without the need to have direct visual contact with the flowing gas, it presents the opportunity to perform, in a variety of fluid systems, measurements of gas-flow dynamics that were heretofore not possible. One specific example is the possibility to dynamically image, in vivo, the ventilatory function of the human or animal lung, thus providing information on the physiology of normal lung function or the pathophysiology of lung disease that cannot be obtained by any other means.

Another advantage and application of the present invention is to increase the efficiency of acquisition-intensive hyperpolarized-gas techniques such as apparent-diffusion-coefficient or oxygen-concentration imaging.

In a first aspect, the present invention features a method for generating a pulse sequence for operating a magnetic resonance imaging system for imaging a region of an object, wherein at least a portion of the region contains hyperpolarized noble gas for at least a portion of the time required to apply said pulse sequence, said method comprising:
  a) selecting of spatial-encoding magnetic-field gradients to generate spatial-frequency-space trajectories that comprise at least one of or any combination of the following:
    i) permit the data corresponding to one complete image to be acquired using at most one-half the number of spatial-frequency-space trajectories that would be required for a conventional rectilinear-trajectory gradient-echo pulse sequence with equivalent spatial resolution;
    ii) for at least one-half of said spatial-frequency-space trajectories, begin at approximately zero spatial frequency along at least two spatial-frequency axes;
    iii) for at least one-half of the spatial-frequency-space trajectory duration, provide motion-induced phase shifts that are less than those corresponding to the frequency-encoding magnetic-field gradient for a conventional rectilinear-trajectory gradient-echo pulse sequence with equivalent spatial resolution;
    iv) provide motion-induced phase shifts that vary smoothly along said spatial-frequency-space trajectories;
    v) sample approximately the same total extent of spatial-frequency space and approximately the same proportions of low, middle and high spatial frequencies;
    vi) provide diffusion-induced signal attenuation that is less than that corresponding to the frequency-encoding magnetic-field gradient for a conventional rectilinear-trajectory gradient-echo pulse sequence with equivalent spatial resolution; and
    vii) use a data-sampling period that is chosen based on the application, said object and strength of a main magnet system of said magnetic resonance imaging system to yield a pre-determined or desired level of magnetic field inhomogeneity-induced image artifacts;
  b) selecting of excitation radio-frequency pulse flip angles wherein said flip angles are specifically chosen to use a fraction of the non-equilibrium hyperpolarized magnetization, said fraction determined based on the total number of images to be acquired from said region of said object;
  c) generating of magnetic resonance signals from said object by applying radio-frequency pulses to excite nuclear magnetization with said flip angles and by applying said spatial-encoding magnetic-field gradients; and
  d) reconstruction of a magnetic resonance image from the generated magnetic resonance signals.

In a second aspect, the present invention features a magnetic resonance imaging system for generating a pulse sequence for operating the system for imaging a region of an object, wherein at least a portion of the region contains hyperpolarized noble gas for at least a portion of the time required to apply said pulse sequence, the system comprising:
  main magnet system for generating a steady magnetic field in at least a region of the object to be imaged;
  gradient magnet system for generating temporary magnetic-field gradients in at least a region of the object to be imaged;
  radio-frequency transmitter system for generating radio-frequency pulses in at least a region of the object to be imaged;
  radio-frequency receiver system for receiving magnetic resonance signals from at least a region of the object to be imaged;
  reconstruction system for reconstructing an image of at least a region of the object from the received magnetic resonance signals; and
  control system for generating signals controlling the gradient magnet system,
  the radio-frequency transmitter system, the radio-frequency receiver system, and the reconstruction system, wherein the control system generates signals causing:
  a) selecting of spatial-encoding magnetic-field gradients to generate spatial-frequency-space trajectories that comprise at least one of or any combination of the following:
    i) permit the data corresponding to one complete image to be acquired using at most one-half the number of spatial-frequency-space trajectories that would be required for a conventional rectilinear-trajectory gradient-echo pulse sequence with equivalent spatial resolution;
    ii) for at least one-half of said spatial-frequency-space trajectories, begin at approximately zero spatial frequency along at least two spatial-frequency axes;
    iii) for at least one-half of the spatial-frequency-space trajectory duration, provide motion-induced phase shifts that are less than those corresponding to the frequency-encoding magnetic-field gradient for a conventional rectilinear-trajectory gradient-echo pulse sequence with equivalent spatial resolution;
    iv) provide motion-induced phase shifts that vary smoothly along said spatial-frequency-space trajectories;
    v) sample approximately the same total extent of spatial-frequency space and approximately the same proportions of low, middle and high spatial frequencies;
    vi) provide diffusion-induced signal attenuation that is less than that corresponding to the frequency-encoding magnetic-field gradient for a conventional rectilinear-trajectory gradient-echo pulse sequence with equivalent spatial resolution; and
    vii) use a data-sampling period that is chosen based on the application, said object and strength of said main magnet system to yield a pre-determined of desired level of magnetic field inhomogeneity-induced image artifacts;
  b) selecting of excitation radio-frequency pulse flip angles wherein said flip angles are specifically chosen to use a fraction of the non-equilibrium hyperpolarized magnetization, said fraction determined based on the total number of images to be acquired from said region of said object;

c) generating of magnetic resonance signals from said object by applying radio-frequency pulses to excite nuclear magnetization with said flip angles and by applying said spatial-encoding magnetic-field gradients; and d) reconstructing of a magnetic resonance image from the generated magnetic resonance signals.

In a third aspect, the present invention features a computer readable media carrying encoded program instructions for causing a programmable magnetic resonance imaging system to perform the method discussed above in the first aspect of the invention. Similarly, the invention features a computer program product comprising a computer useable medium having computer program logic for enabling at least one processor in a magnetic resonance imaging system to generate a pulse sequence, the computer program logic comprising the method discussed above in the first aspect of the invention.

These and other objects, along with advantages and features of the invention disclosed herein, will be made more apparent from the description, drawings and claims that follow.

BRIEF DESCRIPTION OF THE DRAWINGS

The foregoing and other objects, features and advantages of the present invention, as well as the invention itself, will be more fully understood from the following description of preferred embodiments, when read together with the accompanying drawings, in which:

FIG. 1 shows a graphical representation of the measured (solid curve) and theoretical (dashed curve) k-space trajectories for a single gradient axis of a 24-interleaf spiral pulse sequence. The measured waveform demonstrates a slightly decreased amplitude and a varying temporal shift compared to its theoretical counterpart.

FIGS. 2(A)–2(D) show MR coronal breath-hold $^3$He images in a healthy volunteer from interleaved-spiral pulse sequences using (a) 8-interleaves, (b) 16-interleaves or (c) 24-interleaves and from (d) a standard gradient-echo pulse sequence, respectively. There is a substantial decrease in susceptibility-induced artifacts (e.g., arrows) as the number of interleaves is increased from 8 to 24, corresponding to a decrease in the data-sampling period from 10.2 to 3.4 ms. The overall image quality for the 24-interleaf spiral pulse sequence is comparable to that for the reference gradient-echo technique. The ventilation defect in the upper row of images is a pneumatocele.

DETAILED DESCRIPTION OF THE INVENTION

In the following, first presented is an exemplary embodiment of a MR system for practicing the MR methods of the present invention for imaging an object, moving or stationary. Following are descriptions of preferred and alternative embodiments of the methods of the present invention, including their exemplary implementation as computer hardware, firmware, and/or software.

An Exemplary MR-System of the Present Invention

Figure 9:
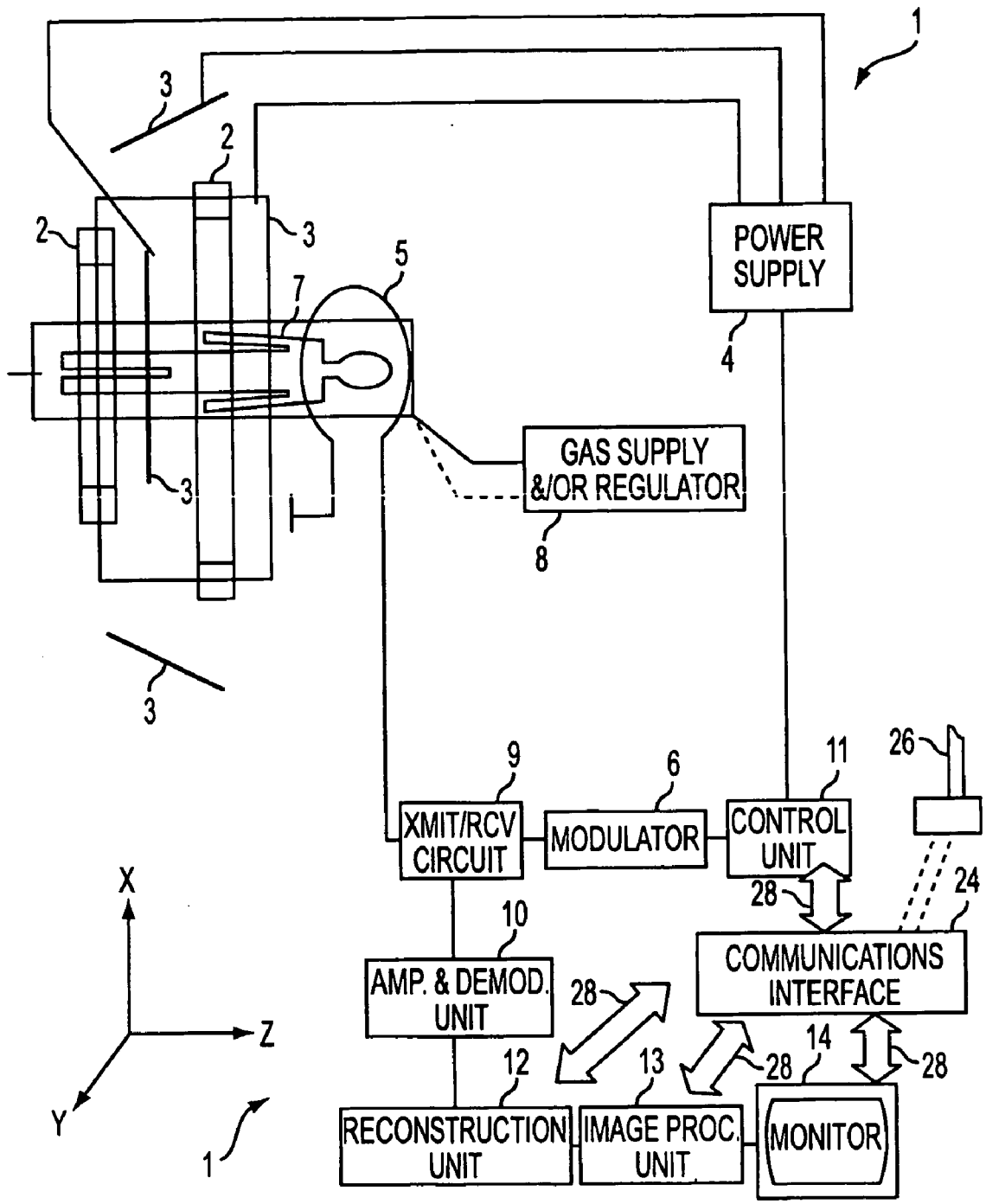
FIG. 9 illustrates a simplified exemplary embodiment of a MRI system for practicing the present invention. The present invention method can be applied to various commercially available MRI systems.

FIG. 9 illustrates a simplified schematic of a MR system 1 for practicing the present invention. The MR system 1 includes a main magnet system 2 for generating a steady magnetic field in an examination zone(s) of the MR system.

The z-direction of the coordinate system illustrated corresponds to the direction of the steady magnetic field generated by the magnet system 2.

The MR system also includes a gradient magnet system 3 for generating temporary magnetic fields $G_x$, $G_y$ and $G_z$ directed in the z-direction but having gradients in the x, y or z directions, respectively. With this magnetic gradient system, magnetic-field gradients can also be generated that do not have directions coinciding with the main directions of the above coordinate system, but that can be inclined thereto, as is known in the art. Accordingly, the present invention is not limited to directions fixed with respect to the MR system. In this application, for ease of description, the directions x, y and z (and the gradients along these directions) are used for the read direction, the phase-encode direction and slice-selection direction (or second phase-encode direction for 3D imaging), respectively.

Also, while traditional commercial methods provide linear gradients in the x, y, or z directions it is also possible not to utilize all three of these linear gradients. For example, rather than using a linear z gradient, one skilled in the art can use a z-squared dependence or some other spatial dependence to provide desired results.

The magnet systems 2 and 3 enclose an examination zone(s) which is large enough to accommodate a part of an object 7 to be examined, for example a part of a human patient. A power supply means 4 feeds the gradient magnet system 3.

The MR system also includes an RF transmitter system including RF transmitter coil 5, which generates RF pulses in the examination zone or region and is connected via transmitter/receiver circuit 9 to a RF source and modulator 6. The RF transmitter coil 5 is arranged around the part of body 7 in the examination zone or region.

The MR system also comprises an RF receiver system including an RF receiver coil, which is connected via transmitter/receiver circuit 9 to signal amplification and demodulation unit 10. The receiver coil and the RF transmitter coil 5 may be one and the same coil.

A gas supply (and/or gas regulator) 8 provides hyperpolarized noble gas to the examination zone or region of the object/subject (body, cavity, or the like). The gas supply may be an attachable supply line to the object/subject or may be a portable gas supply such as a container, bolus delivery device, or dose bag. As would be appreciated by one skilled in the art, there are wide variety of methods and systems adapted for supplying hyperpolarized gas to the object or subject (or region and examination zone). For magnetic resonance imaging using hyperpolarized gases see pending and co-assigned U.S. patent application Ser. No. 09/804,369 filed on Mar. 12, 2001, entitled "*Diagnostic Procedures Using Direct Injection of Gaseous Hyperpolarized* 129*Xe and Associated Systems and Products*", and pending and co-assigned International Patent Application Ser. No. PCT/US01/07812 filed Mar. 12, 2001, entitled "*Diagnostic Procedures Using Direct Injection of Gaseous Hyperpolarized* 129*Xe and Associated Systems and Products*" (Publication No. WO/01/67955 A2), the entire disclosures of which are hereby incorporated by reference herein in their entirety; and pending and co-assigned U.S. patent application Ser. No. 09/832,880 filed on Apr. 12, 2001, entitled "*Exchange-Based NMR Imaging And Spectroscopy Of Hyperpolarized Xenon*-129", the entire disclosure of which is hereby incorporated by reference herein in its entirety.

The MR system also includes an amplification and demodulation unit 10, which, after excitation of nuclear spins within a part of the body or object placed within the examination space by RF pulses, after encoding by the magnetic-field gradients and after reception of the resulting MR signals by the receiver coil, derives sampled phases and amplitudes from the received MR signals. An image reconstruction unit 12 processes the received MR imaging signals to, inter alia, reconstruct an image by methods well-known in the art, such as by Fourier transformation. It should be appreciated by one skilled in the art that various reconstruction methods may be employed besides the Fourier Transform (FT) depending on factors such as the type of signal being analyzed, the available processing capability, etc. For example, but not limited thereto, the present invention may employ data gridding followed by Fourier transform, Short-Time FT (STFT), Discrete Cosine Transforms (DCT), or wavelet transforms (WT). By means of an image processing unit 13, the reconstructed image is displayed, for example, on monitor 14. Further, the image reconstruction unit can optionally process MR navigator signals to determine the displacement of a portion of the subject, animal or object.

The MR system also includes a control unit 11 that generates signals for controlling the RF transmitter and receiver systems by means of a modulator 6, the gradient magnetic field system by means of the power supply means 4, an image reconstruction unit 12 and an image processing unit 13. In a preferred embodiment, the control unit 11 (and other control elements in the MR system) are implemented with programmable elements, such as one or more programmable signal processors or microprocessors, communicating over busses with supporting RAM, ROM, EPROM, EEPROM, analog signal interfaces, control interfaces, interface to computer-readable media and so forth. These programmable elements are commanded by software or firmware modules loaded into RAM, EPROM, EEPROM or ROM, written according to well-known methods to perform the real-time processing required herein, and loaded from computer-readable media (or computer useable medium), such as magnetic disks or tapes, or optical disks, or network interconnections, removable storage drives, or so forth. The present invention may be implemented using hardware, software or a combination thereof and may be implemented in one or more computer systems or processing systems, such as personal digit assistants (PDAs) or portable or wireless machines, for various applications, e.g., remote care and portable care practices.

In a less preferred embodiment, the control unit that directs a MR system for practicing the present invention can be implemented with dedicated electronic components in fixed circuit arrangements. In this case, these dedicated components are arranged to carry out the method described above. For example, the invention is implemented primarily in hardware using, for example, hardware components such as application specific integrated circuits (ASICs). Implementation of the hardware state machine to perform the functions described herein will be apparent to persons skilled in the relevant art(s).

In particular, the control unit commanded by its loaded software causes the generation of MR signals by controlling the application of MR pulse sequences, which comprise RF-pulses, time delays and temporary magnetic-field gradient pulses. These pulse sequences are generated according to the methods of the present invention as subsequently described, and generally include 2D and 3D imaging pulse sequences and optionally navigator pulse sequences for determining the displacement of a portion of the subject, animal or material.

Furthermore, according to alternate embodiments of the present invention, the MR system also optionally includes various other units (not illustrated) from which the state of motion of the part of the subject, animal or object being imaged can be measured. These can include sensors directly indicating the instantaneous state of motion of the part being imaged, such as a chest belt for directly indicating chest displacement during respiration, or MR-active micro-coils whose position can be tracked, or optical means, or ultrasound means, or so forth. These units can also include sensors indirectly indicating the instantaneous state of motion of the part of the subject, animal or object being imaged. For example, electrocardiogram and peripheral pulse sensors measure the temporal progress of the cardiac cycle, and permit inference of the actual state of motion of the heart from knowledge of cardiac displacements associated with each phase of the cardiac cycle. When these sensors are present to measure the state of motion, the control unit need not generate navigator pulse sequences.

Moreover, the control unit 11 may also include a communications interface 24. The communications interface 24 allows software and data to be transferred between and among the control unit 11, reconstruction unit 12, image processing unit 13, and monitor 14 and external devices. Examples of the communications interface 24 may include a modem, a network interface (such as an Ethernet card), a communications port, a PCMCIA slot and card, etc. Software and data transferred via communications interface 24 are in the form of signals which may be electronic, electromagnetic, optical or other signals capable of being received by communications interface 24. The signals are provided to communications interface 24 via the communications path (i.e., channel) 26. The channel 26 carries signals and may be implemented using wire or cable, fiber optics, a phone line, a cellular phone link, a RF link, IR link and other communications channels.

The preferred embodiments of the present invention may be implemented as software/firmware/hardware with various MR systems, and methods, as one skilled in the art would appreciate. Other exemplary systems and methods, but not limited thereto, are disclosed in the following U.S. Patents, of which are hereby incorporated by reference in their entirety herein: U.S. Pat. No. 6,281,681 B1—Cline et al.; U.S. Pat. No. 6,230,039 B1—Stuber et. al.; U.S. Pat. No. 5,749,834—Hushek; U.S. Pat. No. 5,656,776—Kanazawa; U.S. Pat. No. 5,604,435—Foo et al.; and U.S. Pat. No. 5,485,086—Meyer et al.

Preferred and Alternative Embodiments of the Methods of the Present Invention

The present invention applies to, among other things, the situation wherein there is a structure, system or material into which hyperpolarized gas can be introduced, and optionally, within which flowing gas may exist. Within a time frame on the order of the characteristic NMR time constants for hyperpolarized gases in the given structure, system or material, the invention provides the means to generate MR image series with high spatial resolution, negligible image artifacts and either high temporal resolution for a relatively small number of image slices or low temporal resolution for a relatively large number of slices. In the case of flowing gas, this acquisition yields a dynamic image series that depicts the gas flow. For our purposes, we define the "hyperpolarized" state as a large (relative to the thermal equilibrium polarization for the polarizable gas in the applied static magnetic field), non-equilibrium nuclear polarization created by any method, including but not limited to optical pumping and spin exchange (See Walker T. G., Happer W., "Spin-exchange Optical Pumping of Noble Gas Nuclei", Rev. Mod. Phys., 1997, 69:629–642).

A primary object of the invention is the MRI pulse sequence used to generate the image series described immediately above. The present invention method and system may include all or some the features/requirements of this pulse sequence that are listed immediately below.

1) A small number of RF pulses per image, which use appropriately chosen flip angles, that are used to provide efficient use of the non-equilibrium, hyperpolarized magnetization. "Small" means that the number of RF pulses per complete image is equal to or less than half the number that would be required for a conventional, rectilinear-trajectory gradient-echo image having equivalent spatial resolution.

2) The k-space sampling strategy is compatible with high temporal resolution, fluoroscopic depiction of dynamic processes. This requirement dictates that a majority of the k-space trajectories include the central portion of k space.

3) The k-space sampling strategy provides a low sensitivity to motion, thus yielding a low level of motion-induced artifacts. This requirement dictates that motion-induced phase shifts are relatively small and vary smoothly along the k-space trajectory. A specific temporal order for the k-space trajectories may used to achieve improved motion-artifact behavior.

4) The k-space sampling strategy permits temporal resolution to be traded for spatial coverage without disrupting the fundamental structure of the pulse sequence. This requirement dictates that each of the k-space trajectories samples approximately the same total extent of k space and approximately the same proportions of low, middle and high spatial frequencies.

5) The encoding gradient waveforms result in a low level of diffusion-induced signal attenuation, which depends on both the absolute amplitude and time dependence of the waveforms.

6) The data-sampling period per excitation is matched to the level of magnetic field inhomogeneities for the particular application so as to yield negligible inhomogeneity-induced image artifacts. This requirement dictates that off-resonance induced phase-shifts that accumulate over the course of the data-sampling period for each excitation are relatively small, or, if not small, can be corrected.

The following non-limiting Examples are intended to further illustrate the present invention.

EXAMPLE NO. 1

A specific pulse-sequence implementation that satisfies the six general requirements listed above is useful to illustrate the nature of the invention. For this purpose, we will discuss the case of an interleaved-spiral-type pulse sequence (See Meyer C. H., Hu B. S., Nishimura D. G., Macovski A., "Fast Spiral Coronary Artery Imaging", Magn. Reson. Med., 1992, 28:202–213 [herein after "Meyer, Hu et al."]). This k-space trajectory was chosen as a starting point because, by nature, an interleaved spiral satisfies requirements (1), (2), (3) and (4). The interleaved-spiral trajectories were designed specifically for $^3$He imaging and were optimized specifically to meet requirement (6). Further, we demonstrated that these optimized trajectories meet requirement (5) for $^3$He imaging. In addition, we implemented a specific temporal ordering for the acquisition of the spiral trajectories that further decreases the level of motion artifacts.

We have used the resulting optimized spiral pulse sequence to acquire dynamic images of hyperpolarized $^3$He being inhaled and exhaled by human subjects (See Salerno M., Altes T. A., Brookeman J. R., de Lange E. E., Mugler III J. P., "*Dynamic Spiral MRI of Pulmonary Gas Flow Using Hyperpolarized $^3$He: Preliminary Studies in Healthy and Diseased Lungs*", Magn. Reson. Med., 2001, 46:667–677, and herein after "Salerno, Altes et al."); details of the pulse sequence design and examples of the dynamic imaging results are given below. This initial experience in healthy volunteers and in subjects with lung pathology has demonstrated the potential of this new tool for capturing the features of lung gas-flow dynamics. We have also used the optimized spiral pulse sequence to improve the efficiency of data collection for thin-slice volumetric imaging of the lung (See Salerno M., Brookeman J. R., Mugler III J. P., "*High-resolution Volumetric Imaging of the Lung Air Spaces Using Hyperpolarized $^3$He and Spiral-trajectory Pulse Sequences*", In: Proc. Intl. Soc. Magn. Reson. Med., 9$^{th}$ Meeting, 2001, 943) and for apparent diffusion coefficient measurements in the lung (See Salerno M., Brookeman J. R., Mugler III J. P., "*Whole-lung Hyperpolarized $^3$He Diffusion MR Imaging Using Interleaved-Spiral Trajectories*", In: Proc. Intl. Soc. Magn. Reson. Med., 9$^{th}$ Meeting, 2001, 942), both using hyperpolarized $^3$He.

The experimental results described below were acquired using a 1.5 Tesla commercial whole-body imager (Magnetom Vision, Siemens Medical Systems, Iselin, N.J.) modified by the addition of a broad-band RF amplifier to permit operation at the $^3$He resonant frequency of 48 MHz. Spiral-trajectory characterization measurements were performed using a spherical doped-water phantom in the circularly polarized head RF coil supplied with the imager. Hyperpolarized-gas studies used a flexible $^3$He-chest RF coil (IGC Medical Advances, Milwaukee; Wis.). $^3$He experiments were performed under a physician's Investigational New Drug application (IND 57,866) for imaging with hyperpolarized $^3$He using a protocol approved by our institutional review board. Throughout each study, the subject's heart rate and oxygen saturation level were monitored. A physician supervised all procedures. The $^3$He gas was polarized by collisional spin exchange with an optically pumped rubidium vapor using a commercial system (Model 9600 Helium Polarizer; Nycomed-Amersham Imaging, Durham, N.C.). After polarization, the gas was transferred to a Tedlar plastic bag (Jensen Inert Products, Coral Springs, Fla.), transported to the imager and inhaled by the subject. The $^3$He polarization levels ranged from 30–42%.

Interleaved-Spiral Pulse Sequence Design and Evaluation

Signal-to-Noise Considerations

Since the hyperpolarized magnetization is several orders of magnitude larger than the thermal-equilibrium magnetization, the MR experiment has available a fixed magnetization that must be managed appropriately to maximize the signal-to-noise ratio (SNR) and to insure that sufficient magnetization is available throughout the acquisition. Neglecting relaxation and inflow effects, and assuming that all magnetization experiences the same RF-pulse history, the signal $S_n$ from the n$^{th}$ RF pulse of constant flip angle $\theta_c$ is:

$$S_n \propto M_{hp}[\cos\theta_c]^{(n-1)}\sin\theta_c \quad [1]$$

where $M_{hp}$ is the initial hyperpolarized magnetization. From Eq. [1], now including relaxation and diffusion factors, the image signal-to-noise ratio $SNR_i$ for the i$^{th}$ image in a dynamic series can be approximated as:

$$SNR_i \propto M_{hp}\sqrt{T_S n}[\cos\theta_c]^{(n(i-1/2)-1)}[\sin\theta_c]e^{-(n(i-1/2)-1)TR/T1}e^{-TE/T2^*}e^{-bD} \quad [2]$$

where $T_S$ is the data-sampling period for each excitation, n is the number of RF pulses per image, TR and TE are the repetition and echo times respectively, D is the effective diffusivity, and b describes the diffusion-induced signal attenuation at the echo time from the applied gradients. Equation [2] indicates that for a given flip angle, decreasing the number of RF pulses per image increases the SNR of the i$^{th}$ image. Thus, from an SNR perspective, methods that collect multiple lines (or the equivalent) of k-space data for each excitation RF pulse, such as interleaved-spiral imaging, are favorable compared to conventional gradient-echo techniques. Considering the relatively short T2*(~10 ms) for $^3$He in the lung, the very short echo time that can be achieved with spiral imaging is also an important advantage.

The RF-pulse flip angle should be chosen to insure that sufficient magnetization is available towards the end of the dynamic series. However, if there is a substantial inflow of "fresh" magnetization during the experiment, such is the case for imaging during inspiration, Eq. [2] provides the lower bound for the actual SNR of the i$^{th}$ image. In this situation, it may be appropriate to use an RF-pulse flip angle that is larger than the value that would be chosen based on Eq. [2], thus providing an overall increase in the SNR for the dynamic series. For example, based on the pulse sequence parameter values used in our preliminary experiments, Eq. [2] indicates that a flip angle of 5° would result in an SNR for the last image in the dynamic series that is reduced by more than 99% compared to the SNR for the first image. Nonetheless, a flip angle of 5° provided good visualization of gas dynamics, and thus appears to be a reasonable choice for the breathing protocol we have used. This indicates, as would be intuitively expected, that there were substantial inflow effects. When there are substantial inflow effects, quantitative interpretation of the origin of time-dependent signal changes becomes complicated because the number of RF pulses, and the T1 history (T1 depends strongly on the $O_2$ concentration (See Saam B., Happer W., Middleton H., "*Nuclear Relaxation of $^3$He in the Presence of $O_2$*", Phys. Rev. A, 1995, 52:862–865.)), experienced by a given subvolume of the gas is unknown.

Formulation of the Spiral Trajectories

The spiral k-space trajectories were generated based on the analytic solution of Glover (See Glover G. H., "*Simple Analytic Spiral k-space Algorithm*," Magn. Reson. Med., 1999, 42:412–415) for calculating optimized gradient waveforms, which approximates the optimization proposed by King et al. (See King K. F., Foo T. K. F., Crawford C. R., "*Optimized Gradient Waveforms for Spiral Scanning*", Magn. Reson. Med., 1995, 34:156–160). Software code was developed using MATLAB (MathWorks, Natick, Mass.) that calculated these optimized gradient waveforms while minimizing the data-sampling period given the field of view, matrix size, maximum slew rate and maximum gradient strength. The slew rate may be varied from its maximum value to achieve a desired data-sampling period per interleaf. For the parameters used in our experiments, the spiral trajectories were limited by the maximum slew rate of the system rather than by the maximum gradient strength. For this case, the analytic solution for the complex gradient waveform g(t) for a spiral trajectory with N interleaves can be expressed:

$$g(t) = \frac{1}{\gamma}\frac{N}{FOV}\dot{\theta}(1+i\theta)e^{i\theta} \quad [3]$$

-continued $$\theta(t) = \frac{\beta t^2}{2 + \frac{\beta}{\alpha}t^{4/3}}$$

$$\beta = \frac{S_{max}\gamma FOV}{N}, \alpha = (9\beta/4)^{1/3}$$

where $\gamma$ is the gyromagnetic ratio for $^3$He, FOV is the field of view, and $S_{max}$ is the maximum slew rate. Gradient waveforms were generated for the following parameters: field of view, 50 cm; matrix, 128×128; maximum slew rate, 41.7 T/m/s; number of interleaves, 8, 16 or 24. As the number of interleaves is increased, the required data-sampling period per interleaf decreases. The aforementioned analytical solution, while simplifying gradient waveform generation, violates the slew limit near the origin of k space. This design represents only one of several possible methods for designing a spiral trajectory, based on slew-limit or other criteria, that has the appropriate data-sampling period per interleaf to yield a predetermined or desired level of field-inhomogeneity-induced artifacts.

Diffusion Effects

Since $^3$He has a high diffusion coefficient (~2 cm$^2$/s for the pure gas and ~0.2 cm$^2$/s in the lung parenchyma of a healthy human), application of the spatial-encoding gradients can result in substantial signal attenuation. Depending on the pulse-sequence design, this signal attenuation may be manifested primarily as a loss in the SNR, or as a k-space filter that results in blurring. As indicated in Eq. [2], the signal attenuation can be expressed in terms of the b-value, given as (See Turner R., Le Bihan D., Maier J., Vavrek R., Hedges L. K., Pekar J., "*Echo-planar Imaging of Intravoxel Incoherent Motion*", Radiology, 1990, 177:407–414.):

$$b(t) = \int_0^t |k(t)|^2 dt \quad [4]$$

where k(t) is the time-dependent position in k space as determined by the applied gradients. The b-value at the center of k space reflects the overall diffusion-induced reduction of the image SNR. In spiral imaging, this reduction in the SNR is due only to the slice-select gradient waveform, while in gradient-echo and EPI sequences this reduction has contributions from the slice-select, readout and phase-encoding gradient waveforms. Since the degree of diffusion-induced signal attenuation varies as the square of the area under the gradient waveform, the encoding-gradient requirements for high-resolution gradient-echo, and especially EPI, pulse sequences impose a limit on the attainable resolution (See Saam, Yablonskiy et al.).

The structure of the gradient waveforms for spiral imaging results in an isotropic diffusion-induced filtering of k space as compared to the anisotropic filtering that occurs for gradient-echo or EPI-based methods. The periodic refocusing of the spiral-trajectory waveforms also results in a lower diffusion-induced attenuation at high spatial frequencies than that corresponding to a constant-amplitude waveform having the same area.

For our worst case (i.e., the thinnest slice), the b-value for the slice-select gradient waveform, calculated from Eq. [4], is 0.007 s/cm$^2$. Using a conservative estimate of 1 cm$^2$/s for the diffusivity of $^3$He in the lung, this b-value corresponds to a diffusion-induced signal attenuation of less than 1%. The b-value corresponding to the end of the spiral-trajectory gradient waveforms is 0.09 s/cm$^2$, yielding a diffusion-induced attenuation of less than 9% for the signals that represent the highest spatial-frequency components. From these estimates, we concluded that the diffusion-induced SNR loss and k-space filter effects are negligible for our pulse sequence design.

Trajectory Fidelity

It is well established that actual gradient waveforms, and hence the corresponding k-space trajectories, typically differ by some measurable amount from their intended values due to non-ideal hardware behavior and eddy currents, and that these deviations can lead to substantial image artifacts if not compensated during image reconstruction or otherwise corrected. To address this issue, the fidelity of each of our spiral trajectories was evaluated using the self-encoding technique (See Onodera T., Matsui S., Sekihara K., Kohno H., "*A Method of Measuring Field-gradient Modulation Shapes. Application to High-speed NMR Spectroscopic Imaging*", J. Phys. E: Sci. Instrum., 1987, 20:416–419). A spin-echo-based pulse sequence, wherein the onset of the spiral gradient waveform coincided with the spin echo, was used to minimize off-resonance contributions to the measured signal evolution. In addition, each data set was corrected using the signal evolution recorded in the absence of a spiral gradient waveform. The raw data were Fourier transformed along the self-encoding direction to create line projections of the water phantom. The k-space location of each point in the spiral trajectory was then determined based on the Fourier shift theorem by measuring the slope of the linear phase shift in the spatial domain. The trajectories derived from the self-encoding sequence were compared to their ideal counterparts.

The measured k-space trajectories demonstrated a small difference in amplitude relative to the theoretical trajectories and a temporal shift, resulting from a delay in the onset of the gradient waveforms. A representative pair of measured and theoretical trajectories for a single gradient axis is shown in FIG. 1, illustrating the amplitude difference and temporal delay that were typically observed. The trajectories could not be matched by shifting or scaling the measured waveforms relative to the theoretical waveforms because the temporal shifts varied along the trajectories, and the theoretical trajectories violated the slew limit near the origin, producing a gradient overshoot that was not accounted for in the theoretical waveforms. Images reconstructed based on the theoretical trajectories showed substantial artifacts compared to those reconstructed using the measured trajectories. Thus, the k-space trajectories for all of the spiral pulse-sequence configurations were calculated with the self-encoding method and used in the reconstruction of all images.

Image Reconstruction

For reconstruction, the spiral-trajectory k-space data were interpolated onto a rectilinear grid using a published regridding algorithm (See Meyer, Hu et al.; O'Sullivan J. D., "*A Fast Sinc Function Gridding Algorithm for Fourier Inversion in Computer Tomography*", IEEE Trans. Med. Imag., 1985, 4:200–207; and Jackson J. I., Meyer C. H., Nishimura D. G., "*Selection of a Convolution Function for Fourier Inversion using Gridding*", IEEE Trans. Med. Imag., 1991, 10:473–478). These computations were performed using MATLAB on a Sun Ultra 10 workstation (Sun Microsystems, Palo Alto, Calif.). The data were regridded onto a 256×256 matrix (2× oversampling) using the k-space trajectories measured with the self-encoding technique. The density compensation function (DCF) of Meyer, Hu et al. was used:

$$DCF(t) = |g(t)| \sin [\arg(g(t)) - \arg(k(t))] \quad [5]$$

The actual gradient waveforms were calculated from the time derivative of the measured k-space trajectories. The density compensation function was smoothed by the application of a Chebychev-II filter. An "energy" data matrix was used to record the total signal contribution to each point in regridded k-space data (See Meyer, Hu et al.). The regridded data were subsequently divided by the energy matrix to correct for inaccuracies in the density compensation prior to performing a two-dimensional Fourier transform.

Dynamic image sets were calculated using the sliding window method first proposed by Reiderer et al. (See Reiderer S. J., Tasciyan T., Farzaneh F., Lee J. N., Wright R. C., Herfkens R. J., "*MR Fluoroscopy: Technical Feasibility*", Magn. Reson. Med., 1988, 8:1–15), and later applied to image data from spiral trajectories (See Spielman D. M., Pauly J. M., Meyer C. H., "*Magnetic Resonance Fluoroscopy Using Spirals with Variable Sampling Densities*", Magn. Reson. Med., 1995, 34:388–394). The repetition time of 10 ms that was used to generate the dynamic image sets yielded a pseudo-frame rate of 100 images per second, for a total of 1536 frames; the acquisition time per complete image was 240 ms.

Off-Resonance Effects in Spiral Imaging

Due to the accrual of additional phase shifts during the data-sampling period, structures corresponding to off-resonance magnetization may appear blurred or distorted in spiral images. Established deblurring techniques, such as multi-frequency reconstruction (See Irarrazabal P., Meyer C. H., Nishimura D. G., Macovski A., "*Inhomogeneity Correction Using an Estimated Linear Field Map*", Magn. Reson. Med., 1996, 35:278–282; and Noll D. C., Meyer C. H. Pauly J. M., Nishimura D. G., Macovski A., "*A Homogeneity Correction Method for Magnetic Resonance Imaging with Time-varying Gradients*", IEEE Trans. Med. Imag., 1991, 10:629–637), may be applied to reduce such image degradations. However, since the total amount of image data that can be acquired is limited by the non-equilibrium nature of the hyperpolarized magnetization, and because, for the application at hand, the spatial distribution of off-resonance signal sources changes during the acquisition, the application of such conventional techniques presents substantial practical difficulties. (Nonetheless, it should be noted that for rapid high-spatial resolution static imaging, established deblurring techniques may be applicable.)

Our strategy was instead to decrease the duration of the data-sampling period per spiral interleaf to the point that off-resonance-induced degradations in images of the lung were comparable to those for a conventional gradient-echo pulse sequence. This was achieved by using optimized, slew-limited trajectories and by increasing the number of interleaves per image as necessary, although an SNR penalty does accompany the latter approach (Eq. [2])).

To investigate the relationship between the duration of the data-sampling period per interleaf and the severity of off-resonance-induced artifacts, static $^3$He images of the lung were collected during suspended respiration in a healthy volunteer using interleaved-spiral and gradient-echo pulse sequences. For the spiral pulse sequences, 8, 16 and 24 interleaves were used, corresponding to data-sampling periods of 10.2 ms, 5.1 ms and 3.4 ms, and minimum TRs of 13.7 ms, 8.5 ms and 7.5 ms, respectively; the TE was 1.3 ms for all sequences. The parameters for the gradient-echo (FLASH) pulse sequence included: TR/TE, 7/2.7 ms; data-sampling period, 4.1 ms. (These parameters are the same as those used routinely at our institution for $^3$He-ventilation gradient-echo imaging.) The remaining parameters were identical for all pulse sequences: matrix, 128×128; field of view, 50 cm; slice thickness, 15 mm. The flip angles for each of the pulse sequences were chosen to yield approximately equal SNRs for all image sets.

There was a substantial decrease in susceptibility-induced artifacts as the number of interleaves was increased from 8 to 24, corresponding to a decrease in the data-sampling period from 10.2 to 3.4 ms. Further, the severity of susceptibility artifacts for the 24-interleaf pulse sequence was comparable to that for the reference gradient-echo technique. These findings are illustrated in FIG. 2, which shows two coronal $^3$He images from each of the four pulse sequences. Although each set of images was acquired during a separate breath-hold period, nearly identical slice positions were achieved as seen in the figure. In the central coronal slices, the images from the 8-interleaf pulse sequence (FIG. 2(A), lower row) demonstrated significant susceptibility-induced distortion and blurring, particularly at the interface between the diaphragm and lung (arrows, FIG. 2(A)). These artifacts were reduced for the 16-interleaf pulse sequence, but blurring was still evident at the diaphragm (FIG. 2(B)). The inferior border of the lung was visibly sharper in images from the 24-interleaf pulse-sequence (FIG. 2(C)). In a more posterior slice this subject had a pneumatocele, whose borders were similarly well defined in the 24-interleaf and gradient-echo images (FIGS. 2(C) and 2(D), upper row). Based on these results, we chose the 24-interleaf pulse sequence for all of the dynamic imaging studies.

The dark structures in the images, which correspond to pulmonary blood vessels, appeared more sharply defined in the spiral images than in the gradient-echo images. This effect is likely due to a difference in the form of the T2\*-decay-induced k-space filtering for the spiral pulse sequences compared to that for the gradient-echo pulse sequence. The magnetic-field inhomogeneities associated with the vascular structures are evidenced by the decrease in the apparent size of vessels that was observed as the data-sampling period per interleaf was shortened.

Dynamic Imaging Results

Motion Artifacts Versus Acquisition Order

In a study by Pipe et al. (See Pipe J. G., Ahunbay E., Menon P., "*Effects of Interleaf Order for Spiral MRI of Dynamic Processes*", Magn. Reson. Med., 1999, 41:417–422 [herein after "Pipe, Ahunbay et al."]), the relationship between the acquisition order of the spiral interleaves and the severity of motion artifacts was investigated. The "skip" acquisition order used in this study, wherein odd-numbered interleaves are first collected, followed by even-numbered interleaves, appeared well suited for our application. Therefore, we compared the motion-artifact characteristics of the skip acquisition order to those of the standard-sequential acquisition order by acquiring $^3$He dynamic image sets in four healthy volunteers. The resulting images were evaluated for motion-induced artifacts.

Figure 3A:
FIGS. 3(A)–3(B) show MR images that provide a comparison between (a) standard-sequential and (b) "skip" acquisition orders, respectively. The images show four coronal $^3$He dynamic images from early inspiration for each order. The sequential order demonstrates severe motion artifacts that are located near the anatomy of interest. With the skip order, some of the motion-artifact power is displaced by half of the field of view (arrows), providing substantially improved visualization of the trachea and main bronchi.
Figure 3B:

During periods of rapid signal intensity change, particularly early inspiration, substantial motion artifacts were observed with the standard-sequential acquisition order. These artifacts closely approximated the source structures, both in shape and position, and thus significantly degraded the image quality. As illustrated in FIG. 3, the skip acquisition order shifted a large portion of such artifacts by one-half of the field of view, which was typically outside of the region of interest, and therefore greatly improved the image quality. For both acquisition orders, motion artifacts were most pronounced during early inspiration and rapid expiration. Since the motion-artifact characteristics of the skip acquisition order were more benign, it was used for all subsequent dynamic imaging studies.

Typical Dynamic Imaging Protocol

For each series of dynamic images, the subject was instructed to inhale and then exhale a gas mixture containing 0.35 L of polarized $^3$He, diluted to a total volume of 1.0 L with a filler gas ($N_2$ or $^4$He), over a period of 15 seconds. Typically, sixty-four spiral images were collected using the following pulse sequence parameters: TR/TE, 10/1.3 ms; flip angle, 5°; matrix, 128×128; field of view, 50 cm; slice thickness, 15–30 mm; number of interleaves, 24.

Figure 4:
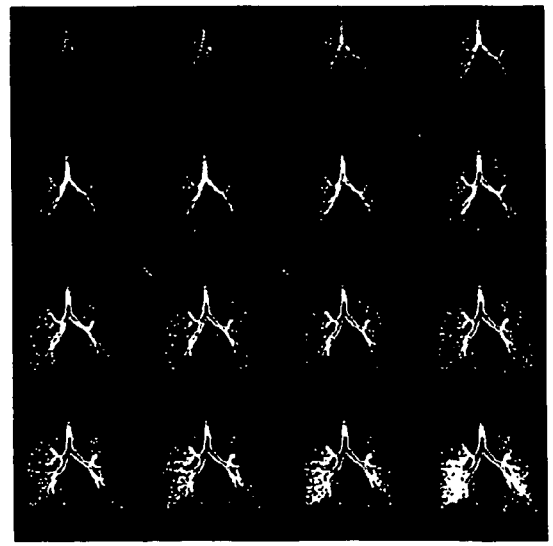
FIG. 4 shows MR coronal dynamic $^3$He images at 20-ms intervals (every other frame) during early inspiration in a healthy volunteer. These images depict filling of the bronchial tree and initial parenchymal enhancement with high temporal resolution and minimal artifacts. The motion artifacts seen in the first few frames are due to incomplete k-space data.
Figure 5:
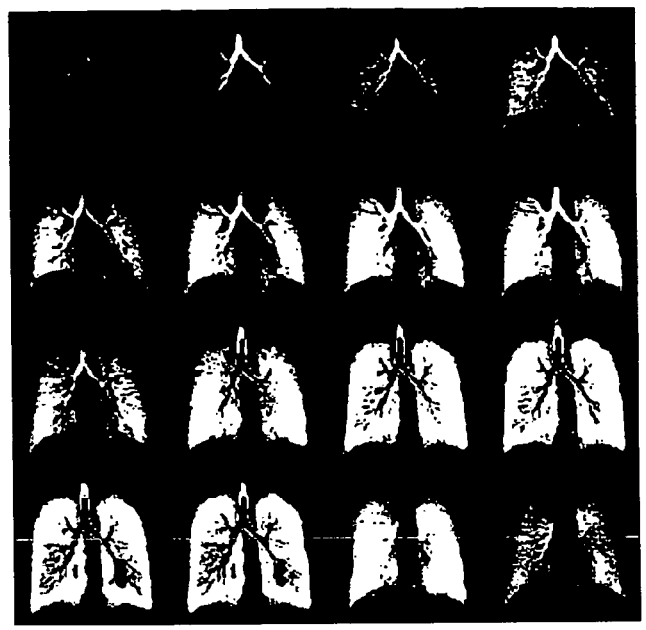
FIG. 5 shows MR coronal dynamic $^3$He images depicting inspiration and expiration in a healthy volunteer. The images in the first row are at 250-ms intervals, and those in the remaining rows are at 1-second intervals. These images are from the same set as the early-inspiration images shown in FIG. 4.

The 24-interleaf spiral pulse sequence, which generated a fluoroscopic image series that was updated every 10 ms, was capable of capturing the filling of the bronchial tree with high temporal resolution. For example, FIG. 4 shows a subset of the dynamic $^3$He images from a healthy volunteer during the first 300 ms of early inspiration. The onset of parenchymal enhancement occurred 150–200 ms after signal was first detected in the trachea. Filling of the bronchial tree could be visualized to the second or third segmental bronchi. When this complete data set was displayed in a cine loop, a periodic modulation of the signal amplitude, which resulted from cardiac motion, was apparent in the left lung. Since the period between image updates was much shorter than the cardiac cycle, there were no cardiac-related motion artifacts. As illustrated in FIG. 5, inspiration and expiration were clearly visualized in this volunteer over the 15-second duration of the experiment.

Dynamic Imaging in Various Orientations

To assess the image quality in various orientations, dynamic image sets, using the skip acquisition order, were acquired in sagittal, coronal and axial orientations. All image sets were obtained from the same healthy volunteer during a single imaging session. The images were evaluated for motion artifacts and susceptibility-induced distortions.

Figure 6A:
FIGS. 6(A)–6(B) show MR axial and sagittal dynamic $^3$He image sets, respectively, acquired throughout the respiratory cycle during two separate experiments in the same healthy volunteer. The initial filling pattern in the sagittal images highlights the fissure between lobes (arrow). The gravity-dependent difference in ventilation is apparent as an increased signal intensity in the posterior regions of the lung (bottom of axial images, left side of sagittal images).
Figure 6B:
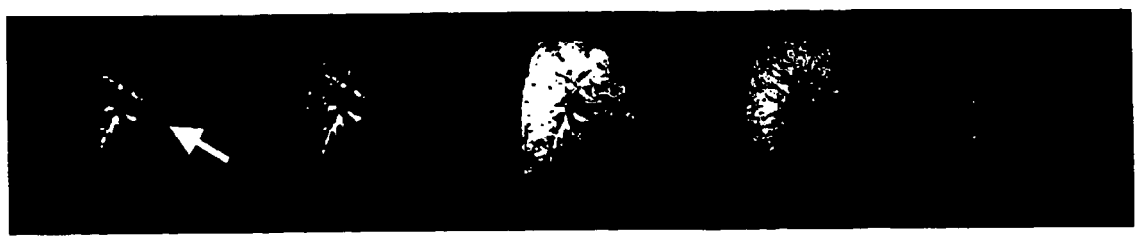

Referring to FIGS. 6(A)–6(B), dynamic image sets of comparable quality were also obtained in sagittal and axial orientations (See Salerno, Altes et al.). Similar to the coronal dynamic images, enhancement in the axial (FIG. 6(A)) and sagittal (FIG. 6(B)) images was first seen in the large airways, and then filled the parenchyma 100–200 ms later. The initial filling pattern in the sagittal images highlighted the fissure between lobes (arrow, FIG. 6(B)). Typically, the large airways were not well visualized during exhalation, which may have been due to rapid flow during exhalation. The well-established gravity-dependent difference in ventilation was apparent on the sagittal and axial dynamic images as evidenced by increased signal intensity in the posterior regions of the lung (FIG. 6(A), bottom of images; FIG. 6(B), left side of images).

Multi-Slice Dynamic Imaging

The potential to trade temporal resolution for anatomical coverage was investigated by modifying the 24-interleaf pulse sequence to collect images from multiple slices in a time-interleaved fashion, analogous to conventional multi-slice imaging. Dynamic image sets were collected in a healthy volunteer at three, equally-spaced axial locations. The minimum TR of 7.5 ms was used, yielding a frame rate of 44 images per second; the acquisition time per complete image was 540 ms.

Figure 7:
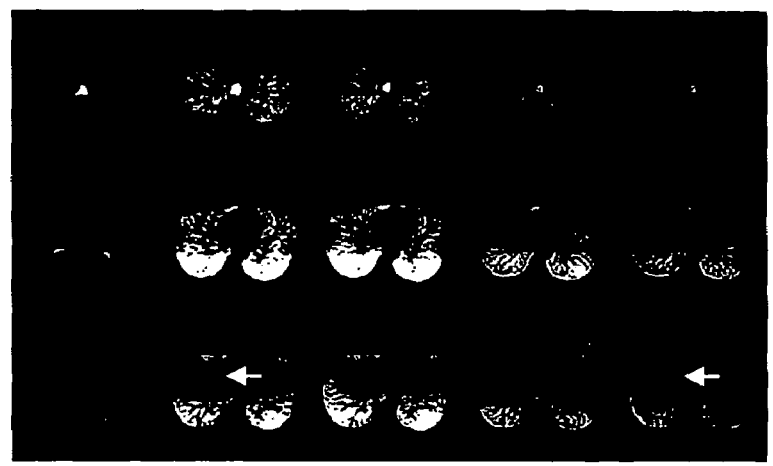
FIG. 7 shows MR axial dynamic $^3$He image sets showing inspiration and expiration in a healthy volunteer. Since the temporal separation between each set of images was only 7.5 ms, three levels of the lung are depicted nearly simultaneously. These images demonstrate the flexibility of the technique to trade temporal resolution for increased anatomical coverage. The diaphragm is seen in inspiration (arrow), subsequently disappears as the lung descends into the imaging slice, and then reappears during expiration.

As shown in the representative images in FIG. 7, excellent visualization of the gas entering and leaving the parenchyma was obtained for the healthy volunteer in whom three slices were collected in an interleaved order. There were some motion artifacts in early inspiration due to the rapid change in signal intensity during this period. In the most inferior slice, the diaphragm was seen on the initial images (arrows, FIG. 7), subsequently disappeared as the lung descended into the imaging slice with inspiration, and then reappeared during expiration.

Discussion

We have developed and optimized an interleaved-spiral pulse sequence for dynamic imaging of lung ventilation using hyperpolarized $^3$He. The slew-limited spiral trajectories used in this pulse sequence were designed to have the minimum data-sampling period for a given field of view, matrix size and number of interleaves. To compensate for non-ideal behavior of the encoding gradients, a self-encoding pulse sequence was used to measure the actual k-space trajectories for image reconstruction. To reduce motion artifacts during periods of rapid signal intensity fluctuations, a non-sequential acquisition order was implemented that shifted a substantial portion of the artifacts away from the anatomy of interest. The pulse-sequence configuration that produced the highest quality images had 24 interleaves and a data-sampling period of 3.4 ms. This configuration produced images with minimal susceptibility- and motion-induced artifacts in the sagittal, coronal and axial orientations. Furthermore, this pulse sequence had the flexibility of imaging multiple slices almost simultaneously. Our initial experience in healthy volunteers demonstrated the potential of this new tool for capturing the features of lung gas-flow dynamics.

The images from the 24-interleaf spiral pulse sequence compared favorably to those from the conventional gradient-echo technique. This is likely the result of the relatively short data-sampling period used in the 24-interleaf pulse sequence. As the spiral trajectories were slew limited, the data-sampling period could be shortened by decreasing the spatial resolution or by increasing the number of interleaves. Since we wanted to maintain a spatial resolution similar to that for current $^3$He static ventilation images, we chose the latter approach. The consequence of this strategy is that the data for each complete image is collected over a longer period, potentially resulting in temporal blurring of rapidly changing features.

High temporal frame rates were achieved by using the sliding-window reconstruction method. Since each spiral interleaf collects data from a range of spatial frequencies, including the center of k space, transitions between successive image frames were typically smooth. However, during periods of rapid signal intensity changes, including early inspiration wherein there is initially no signal, artifacts appeared with the standard-sequential acquisition order, displaced from the source by harmonics of the field of view divided by the number of interleaves (See Pipe, Ahunbay et al.). We chose to minimize these artifacts by altering the acquisition order. By changing to a "skip" acquisition order as described by Pipe et al. (See Pipe, Ahunbay et al.), higher order harmonics are added in k space to the sequential order, resulting in a displacement of some of the artifact power by half of the field of view. For our application, this moved the most severe motion artifacts, which originated from the trachea and main bronchi, to the edge of the region of interest. The skip order was chosen based on simulation results by Pipe, Ahunbay et al. which showed that this order has the most benign motion artifacts during periods when the signal increases from zero on the first interleaf to a maximum intensity on the last interleaf. In the first few frames of inspiration only a small number of interleaves contain signal, which likely explains why some artifacts persist on the early images even with the skip acquisition order (e.g., see the first three images of FIG. 4).

Accordingly, this invention provides, among other things, the means for using hyperpolarized noble gases to generate a series of high-quality magnetic resonance images that combine high temporal and high spatial resolution, and minimal off-resonance artifacts. This technique shall provide insight into altered gas-flow dynamics in lung disease.

EXAMPLE NO. 2

Dynamic Imaging in Patients with Lung Disease

We tested the dynamic interleaved-spiral imaging technique in a variety of lung pathologies including asthma, cystic fibrosis, chronic obstructive pulmonary disease, emphysema secondary to α-1 antitrypsin deficiency, and post lung transplant. The patients were instructed to inhale the gas over the first half, and exhale over the second half, of the 15-second acquisition period. Imaging was performed in the coronal orientation.

Figure 8A:
FIGS. 8A–8C show MR coronal dynamic $^3$He images from patients with, respectively, (a) severe asthma, (b) cystic fibrosis and (c) emphysema secondary to α-1 antitrypsin deficiency. Each set of images demonstrates markedly abnormal lung ventilation, including differences in the rate and distribution of gas flow.

Referring to FIG. 8A, in a patient with severe asthma there were several regions that demonstrated abnormal ventilation patterns. Since this subject's lungs were hyperinflated, as typically seen in this disease, there was limited diaphragmatic excursion during inspiration. The images demonstrated a heterogeneous filling pattern, with portions of the middle lung zones filling prior to the lower lung. It was also evident that some regions of the lung filled at different rates and achieved different maximum signal intensities. Areas that appeared dark throughout the respiratory cycle likely correspond to the ventilation "defects" that have been reported from static image findings (See Altes, Powers et al.). Regions of high signal intensity appeared to enhance at about the same rate as the surrounding parenchyma, but retained signal longer during the expiratory phase.

Figure 8B:

Referring to FIG. 8B, in one of the patients with cystic fibrosis gas could be seen flowing into the bronchiectatic airways. There were scattered areas that appeared well ventilated and there were multiple ventilation defects. The inferior portion of the lung, which continued to enhance throughout inspiration, appeared to be the best ventilated. The rates of gas inflow were heterogeneous in this patient as well, although the distribution and rates of inflow appeared different from those in the asthmatic patient.

Figure 8C:
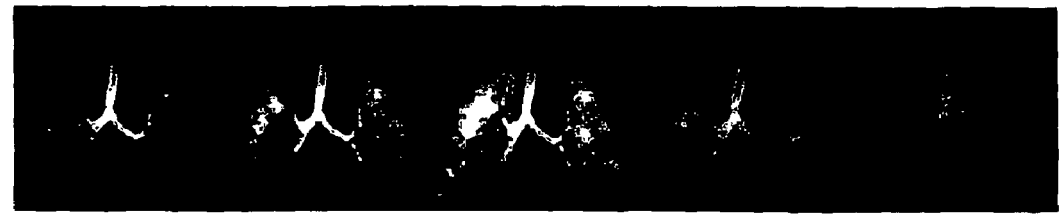

Referring to FIG. 8C, the patient with emphysema secondary to α-1 antitrypsin deficiency also showed altered gas-flow dynamics. In this subject, after gas was seen in the main stem bronchi, the upper lobes began to enhance. There was very poor ventilation to the lower regions of the lung. A region of the right middle lobe appeared to enhance much later than the rest of the lung.

The patient who had undergone lung transplantation (images not shown) showed markedly decreased ventilation to the non-transplanted lung and a more homogeneous ventilatory pattern in the transplanted lung. In the patient with chronic obstructive pulmonary disease (images not shown), there was a heterogeneous pattern of lung enhancement with multiple ventilation defects.

Discussion

Prior to the development of the present invention and its application to dynamic $^3$He imaging, there was no technique to image lung ventilation at high temporal resolution. Thus, this present invention method has the potential to improve one's understanding of the alterations in gas-flow dynamics that occur with disease. Our preliminary studies in patients with a variety of lung pathologies suggest various applications of the present invention technique. For example, dynamic imaging may elucidate the etiology of the ventilation defects and bright spots seen on static $^3$He lung images in a variety of lung diseases. In asthma, insight into the disease process may be gained by imaging the gas-flow dynamics during interventions such as giving a β-2 agonist, which causes bronchodilation. As airway resistance is increased in some portions of the lung in asthma, gas may preferentially flow to the regions of lower resistance resulting in increased signal intensity for these regions. Dynamic imaging of the lung will enable one to test this hypothesis, as well as to understand how these interventions alter gas flow.

Following lung transplantation, dynamic imaging may be useful both for assessing the characteristics of parenchymal filling following surgery and as a non-invasive method to detect the onset of bronchiolitis obliterans, which occurs in lung rejection. Currently, the only means to detect this condition is lung biopsy, an invasive procedure. Furthermore, the present invention and its application to dynamic imaging shall provide insight into the efficacy of different protocols for artificial ventilation in patients with a variety of lung pathologies. This may be particularly useful in neonatal lung disease. Dynamic imaging may be useful to determine whether bronchiomalacia seen on bronchoscopy produces a functional ventilation impairment and thus would likely be responsive to surgical repair.

In conclusion, we have developed a technique capable of visualizing regional ventilatory patterns throughout the respiratory cycle with high temporal and high spatial resolution. The low sensitivity to susceptibility artifacts permits good image quality to be obtained in various orientations. Depending on the application, temporal resolution can be traded for anatomical coverage. Since no other imaging method can provide a comparable combination of spatial and temporal resolution, we expect that the application of the present invention to dynamic imaging of the lung using hyperpolarized gases will provide unique information on the physiology and pathophysiology of the lung, and has the potential for many clinically-relevant applications.

EXAMPLE NO. 3

Introduction

Hyperpolarized $^3$He spin-density imaging of the lung shows promise for characterizing diseases such as asthma and emphysema. As the size, location and shape of ventilation defects resulting from these diseases are highly variable, volumetric imaging with isotropic spatial resolution is desirable for their accurate quantification.

Hyperpolarized $^3$He imaging has most commonly used gradient-echo (GRE) pulse sequences. However, volumetric GRE imaging with isotropic spatial resolution of a few millimeters requires an acquisition time of ~20 seconds, which is longer than the breath-hold duration that can be tolerated by patients with compromised respiratory function.

A goal of this investigation was to develop interleaved-spiral pulse sequences using optimized slew-limited spirals to obtain images covering the whole lung with 4-mm isotropic spatial resolution in under 10 seconds. We compared two strategies: a rapid 2D interleaved-spiral technique with contiguous 4-mm slices, and a single-slab 3D "stack-of-spirals" method (See Irarrazabal P., Nishimura D. G., "Fast Three Dimensional Magnetic Resonance Imaging" Magn. Reson. Med., 1995, 33:656–662). These pulse sequences were evaluated in healthy and diseased subjects.

Methods

Hyperpolarized $^3$He MR imaging was performed in 4 healthy volunteers and in 1 patient with lung pathology using a 1.5-Tesla whole-body imager (Magnetom Vision, Siemens Medical Systems, Iselin, N.J.). Data was acquired during an 8–10 second breath-hold after the subject inhaled 350 ml of 30–45% polarized $^3$He (Model 9600 Helium Polarizer, Nycomed-Amersham Imaging, Durham, N.C.) diluted to 1.0 L with $N_2$. In two of the subjects, image sets were obtained using the 2D and 3D methods on successive breath holds. The 2D interleaved-spiral pulse sequence (TR/TE 9.0/2.0 ms, FA 15°, FOV 50×50 cm, slice thickness 4 mm, matrix 128×128) created a volumetric data set by collecting 50 contiguous coronal images from anterior to posterior. The 3D stack-of-spirals pulse sequence (TR/TE 6.9/0.9 ms, FA 2.5°, FOV 50×50 cm, partitions 50, slab thickness 200 mm, matrix 128×128) employed conventional phase encoding in the anterior-posterior direction. Both pulse sequences used a short data-sampling period (3.4 ms) to limit off-resonance-induced artifacts to a tolerable level. The spiral-trajectory data were amplitude corrected using the signal intensity from each spiral at the center of k space, and then reconstructed via a MATLAB (MathWorks, Natick, Mass.) implementation of a regridding algorithm along k-space trajectories that were measured using a self-encoding pulse sequence.

Results

Figure 10:
FIG. 10 shows MR axial, coronal and sagittal $^3$He images of the lung from a healthy volunteer, reconstructed from a single-slab 3D stack-of-spirals acquisition. An incidental ventilation defect is seen in the left upper lobe.
Figure 11:
FIG. 11 shows axial, coronal and sagittal $^3$He images of the lung from a healthy volunteer, reconstructed from contiguous 2D interleaved-spiral images. An incidental ventilation defect is seen in the left upper lobe.

Referring to FIGS. 10 and 11, both pulse sequences produced volumetric imaging sets with minimal off-resonance or motion-induced artifacts and could be reformatted into high-quality images in the coronal, sagittal or axial orientations. The images were of comparable quality to those produced using a conventional 2D gradient-echo pulse sequence. However, the pulmonary vasculature was more apparent in spiral-trajectory images, likely due to decreased partial volume averaging and the different form of the k-space filter as compared to the gradient-echo images. The 2D interleaved-spiral images demonstrated increased signal in the dependent portion of the lung despite the decay of signal that results from T1 relaxation during data acquisition. The 3D stack-of-spirals images showed a greater anterior-postierior signal gradient since the T1 decay is manifested only as a k-space filter in this acquisition. The stack-of-spirals trajectory did not demonstrate significant motion artifacts even though the data were collected over multiple heart cycles. In the healthy subject shown in FIGS. 10 and 11, an incidentally discovered ventilation defect is clearly visualized in all three orientations (upper rows). Also, the right major fissure is well visualized in the sagittal images (lower right).

Discussion

Both of these imaging strategies produced high-quality ventilation images with isotropic 4-mm resolution during a breath hold duration of less than 10 seconds. This represents a substantial reduction in the acquisition time compared to conventional gradient-echo imaging. Due to the short period over which each image is collected with the 2D pulse sequence, this approach should be robust to motion-induced artifacts. However, the slice-direction resolution may be degraded due to slice profile effects. Also, T1 relaxation between images results in a decrease in the signal intensity over the breath-hold period. In this respect, the stack-of-spirals trajectory should be favored, and is not affected by slice profile imperfections. The periodic signal modulation from cardiac motion could result in motion artifacts, but did not appear to be significant in our studies. The short acquisition time of both pulse sequences, designed according to the methods of the present invention, shall enable full lung volumetric imaging even in patients with compromised respiratory function.

Accordingly, thin-slice 2D interleaved-spiral and 3D stack-of-spirals pulse sequences produced high-quality volumetric ventilation images in a breath hold of less than 10 seconds. These sequences shall be useful for characterizing ventilation patterns in multiple orientations, especially in subjects who cannot tolerate prolonged breath holds.

EXAMPLE NO. 4

Introduction

Recent studies have shown that the apparent diffusion coefficient (ADC) of $^3$He gas is potentially a sensitive probe of lung microstructural changes in emphysema (See Saam B. T., Yablonskiy D. A., Kodibagkar V. D., et al., "MR Imaging of diffusion of $^3$He Gas in Healthy and Diseased Lungs", Magn. Reson. Med., 2000, 44:174–179 [herein after "Saam, Yablonskiy, Kodibagkar et al."]; Salerno M., Brookeman J. R., de Lange E. E., Knight-Scott J., Mugler III J. P., In: Proc. Intl. Soc. Magn. Reson. Med., 8$^{th}$ Meeting, 2000, 9 [herein after "Salerno, Brookeman, de Lange et al."]). One of the current limitations of this technique is that several seconds of data acquisition are required to obtain the data for each ADC image, and thus only a small number of slices (typically, less than 5) can be acquired during a reasonable breath-hold period. This is a particular issue for subjects with compromised respiratory function in whom only two or three slice positions can be obtained. A goal of this investigation was to develop a rapid method for $^3$He ADC imaging, based on an interleaved-spiral pulse sequence, that can provide contiguous 1 to 1.5-cm thick slices of the whole lung in less than 10 seconds.

Methods

Hyperpolarized $^3$He MR imaging was performed using a 1.5-Tesla whole-body imager (Magnetom Vision, Siemens Medical Systems, Iselin, N.J.) in 4 healthy volunteers, in an emphysema patient, and in a subject who had undergone single lung transplantation for idiopathic pulmonary fibrosis. Data were acquired during a 5-second breath-hold after the subject inhaled 350 ml of 30–45% polarized $^3$He (Model 9600 Helium Polarizer, Nycomed-Amersham Imaging, Durham, N.C.) diluted to 1.0 L with $N_2$. A multislice 2D interleaved-spiral pulse sequence (TR/TE 13.5/3.4 Ms, FA 16°, FOV 50×50 cm, slice thickness 1.5 cm, matrix 128×128) was used, and a bipolar gradient was added in the slice-select direction to achieve b-values of 0.4 and 1.6 s/cm$^2$. The data were amplitude corrected using the signal intensity from each spiral at the center of k space, and then reconstructed via a MATLAB (MathWorks, Natick, Mass.) implementation of a regridding algorithm along k-space trajectories that were measured using a self-encoding pulse sequence. ADC images were calculated by linear least squares fitting of the natural log of the signal versus the b-value. In two of the healthy volunteers and in the two subjects with lung disease, ADC images were also obtained using a previously-described gradient-echo pulse sequence (See Salerno, Brookeman, de Lange et al. ) for a subset of the slice positions collected using the spiral pulse sequence.

Results

Figure 12:
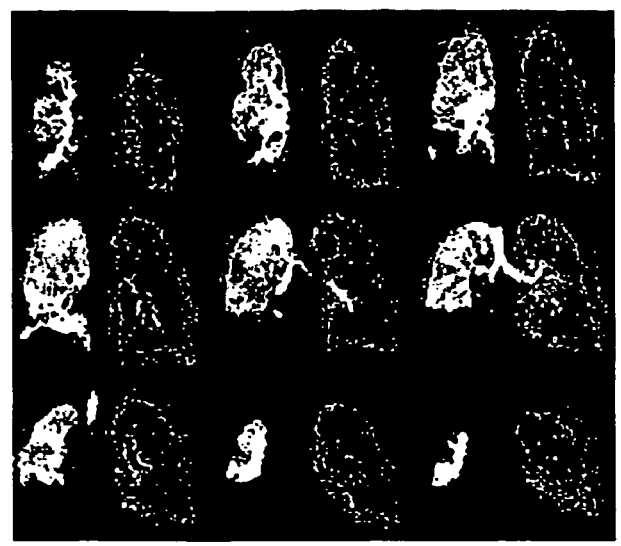
FIG. 12 shows contiguous 1.5-cm thick apparent-diffusion-coefficient MR images from a lung transplant patient obtained using an interleaved-spiral pulse sequence, designed and optimized using the methods of the present invention.
Figure 13:
FIG. 13 shows apparent-diffusion-coefficient (ADC) MR images from the lung transplant patient obtained using a gradient-echo pulse sequence.
Figure 14:
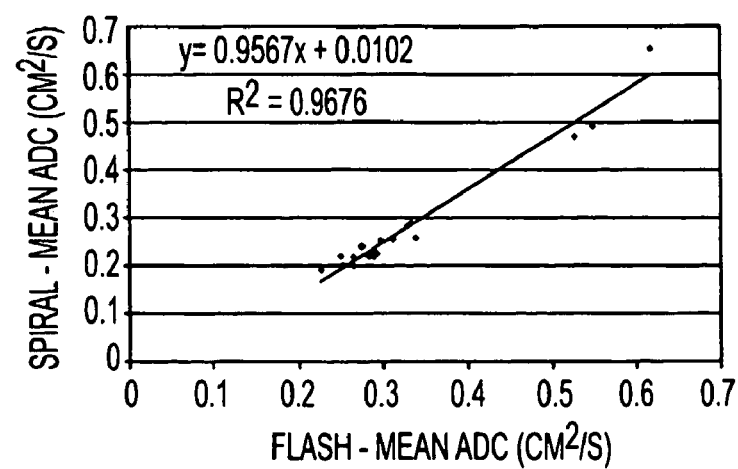
FIG. 14 is graph illustrating the correlation of apparent-diffusion-coefficient (ADC) values from gradient-echo and interleaved-spiral pulse sequences.

ADC images of the entire lung, at contiguous 1.5-cm slice positions, were obtained using the spiral-based pulse sequence in all subjects. FIG. 12 shows a set of spiral ADC images from the transplant patient; gradient-echo ADC images from the same patient are presented in FIG. 13 for comparison. There was good correlation (R=0.98) between the mean ADC values calculated using the spiral and gradient-echo pulse sequences. Referring to the graph shown in FIG. 14, a linear fit of the data has a slope near unity and a small y-intercept indicating equivalent mean ADCs can be determined using either technique. The small differences in the mean ADC values between sequences are likely due to a difference in the encoding direction, different effective diffusion times, and physiological variations between breath-holds. The ADC images demonstrated the gravity-dependent alveolar inflation gradient (See Salerno M., Brookeman J. R., de Lange E. E., Knight-Scott J., Mugler III J. P., In: Proc. Intl. Soc. Magn. Reson. Med., $8^{th}$ Meeting, 2000, 2195), and showed increased ADC values in the subjects with lung pathology, consistent with previous studies of the ADC values in emphysema (See Saam, Yablonskiy, Kodibagkar et al.; Salerno, Brookeman, de Lange et al. ). Furthermore, in the healthy subjects, ADC histograms for the spiral sequence were narrower, possibly from a decreased susceptibility to motion-induced broadening which may occur in the gradient-echo sequence due to the substantially longer acquisition time.

Discussion

The interleaved-spiral diffusion pulse sequence as designed based on the methods of the present invention allows assessment of ADCs to be performed rapidly, enabling full coverage of the lung parenchyma during a short breath hold. As it has been shown that the ADC varies regionally (See Salerno, Brookeman, de Lange et al.) it is important to determine the ADC for the whole lung to prevent bias in calculations of the ADC parameters resulting from the selection of only a small number of slices. The ADC images that are obtained with this technique are similar to those collected with gradient-echo-based pulse sequences, indicating that the spiral pulse sequence can be useful for assessing regional variations in lung microstructure.

Accordingly, interleaved-spiral diffusion-weighted pulse sequences, designed based on the methods of the present invention, provide a means for rapidly assessing ADC values in the whole lung, and shall be especially useful for assessing patients with compromised ventilatory function.

An advantage of the present invention is that it provides the means for using hyperpolarized noble gases to generate a series of high-quality magnetic resonance images that combine high temporal and high spatial resolution. One important application of the present invention is the visualization of gas-flow dynamics without the introduction of secondary tracer materials and without the need to have direct visual contact with the flowing gas. The present invention presents the opportunity to perform, in a variety of fluid systems, measurements of gas-flow dynamics that were heretofore not possible. For example, the ventilatory function of the human or animal lung can be dynamically imaged, in vivo, thus providing information on the physiology of normal lung function or the pathophysiology of lung disease that cannot be obtained by any other means.

Another advantage of the present invention is that it is also designed to permit the high temporal resolution to be easily traded for increased spatial coverage. Using this feature, the invention is broadly applicable to increase the efficiency of acquisition-intensive hyperpolarized-gas techniques.

Further yet, an advantage of the present invention is that it provides a method and system for visualizing the time-dependent distribution of gas using hyperpolarized $^3$He or $^{129}$Xe.

Moreover, in the medical area, the present invention provides an important advantage for the study and characterization of certain properties of the healthy and diseased lung. Since flow gas patterns play an important role in the physiological function of the lung, one would expect that the ability to characterize these properties of the lung in this way will be of substantial importance. More specifically, the present invention shall be useful in certain pulmonary diseases for diagnosis, for following the response to therapy, and for better understanding the pathophysiology of these diseases. In addition, the invention may be useful for better understanding the physiology of the healthy lung, including the changes that occur with aging and smoking.

Still yet, in the medical area, the present invention provides an important advantage by providing an alternative to the existing test or imaging modality that is routinely used to assess the condition of the lung. These include pulmonary function tests (PFTs), chest radiography, x-ray computed tomography (CT), ventilation scintigraphy using inhalation of radioactive gases or aerosols, and conventional (proton) MR imaging.

Additionally, outside the medical area, the present invention provides the capability to characterize a variety of fluid systems in ways that were heretofore not possible. The principles of the present invention discussed throughout this document may be applied to fluid dynamics, as one skilled in the art would appreciate.

Finally, an advantage of the present invention, among other things, for medical applications is that it will permit the gas-flow characteristics of the healthy or diseased lung to be measured in a non-invasive fashion with a combination of spatial and temporal resolution that is unmatched by any current imaging modality. The invention can also be applied to substantially increase the efficiency of various magnetic resonance imaging procedures for hyperpolarized gases.

The invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims rather than by the foregoing description, and all changes which come within the meaning and range of equivalency of the claims are therefore intended to be embraced herein.

We claim:

1. A method for generating a pulse sequence for operating a magnetic resonance imaging system for imaging a region of an object, wherein at least a portion of the region contains hyperpolarized noble gas for at least a portion of the time required to apply said pulse sequence, said method comprising:

a) selecting of spatial-encoding magnetic-field gradients to generate spatial-frequency-space trajectories that:

i) permit the data corresponding to one complete image to be acquired using at most one-half the number of spatial-frequency-space trajectories that would be required for a conventional rectilinear-trajectory gradient-echo pulse sequence with equivalent spatial resolution;

ii) for at least one-half of said spatial-frequency-space trajectories, begin at approximately zero spatial frequency along at least two spatial-frequency axes;

iii) for at least one-half of the spatial-frequency-space trajectory duration, provide motion-induced phase shifts that are less than those corresponding to the frequency-encoding magnetic-field gradient for a conventional rectilinear-trajectory gradient-echo pulse sequence with equivalent spatial resolution;

iv) provide motion-induced phase shifts that vary smoothly along said spatial-frequency-space trajectories;

v) sample approximately the same total extent of spatial-frequency space and approximately the same proportions of low, middle and high spatial frequencies;

vi) provide diffusion-induced signal attenuation that is less than that corresponding to the frequency-encoding magnetic-field gradient for a conventional rectilinear-trajectory gradient-echo pulse sequence with equivalent spatial resolution; and vii) use a data-sampling period that is chosen based on the application, said object and strength of a main magnet system of said magnetic resonance imaging system to yield a pre-determined or desired level of magnetic field inhomogeneity-induced image artifacts;

b) selecting of excitation radio-frequency pulse flip angles wherein said flip angles are specifically chosen to use a fraction of the non-equilibrium hyperpolarized magnetization, said fraction determined based on the total number of images to be acquired from said region of said object;

c) generating of magnetic resonance signals from said object by applying radio-frequency pulses to excite nuclear magnetization with said flip angles and by applying said spatial-encoding magnetic-field gradients; and d) reconstructing of a magnetic resonance image from the generated magnetic resonance signals.

2. The method of claim 1, wherein, for said conventional rectilinear-trajectory gradient-echo pulse sequence, the number of spatial-frequency-space trajectories corresponding to each of the phase-encoded directions is approximately equal to the maximum spatial extent of said object along the given phase encoding directions divided by the desired voxel dimension in said direction.

3. The method of claim 1, wherein data is acquired corresponding to at least one of at least two magnetic resonance images and at least two regions within said object that at some time during the acquisition comprise hyperpolarized noble gas.

4. The method of claim 3, wherein, for at least one of any region within said object for which the data corresponding to at least two magnetic resonance images is acquired, said data is further processed to yield at least one additional image, said additional image reconstructed from some combination of the spatial-frequency data from the individual unprocessed images corresponding to said imaged-region so as to depict, with higher temporal resolution than that provided by the unprocessed images, any movement of the hyperpolarized gas within said object during the acquisition of said data.

5. The method of claim 1, wherein said object is the lung of an animal or of a human.

6. The method of claim 1, wherein the temporal order of data collection for the spatial-frequency-space trajectories corresponding to at least one magnetic resonance image for at least one region within said object is specifically chosen to reduce motion-induced artifacts.

7. The method of claim 3, wherein, for acquisitions comprising at least two regions within said object, the data acquisition order comprises collecting at least one spatial-frequency-space trajectory corresponding to one magnetic resonance image for one region, and at most the complete set of spatial-frequency-space trajectories corresponding to said image, then proceeding to acquire the equivalent spatial-frequency-space trajectory or set of trajectories from a different region within said object, and finally repeating this process for any remaining regions, and then for any remaining spatial-frequency-space trajectories, until all images for all regions have been acquired.

8. The method of claim 7, wherein for at least two magnetic resonance images for each region within said object that therefore comprise a temporal series for each region, said data acquisition order is repeated a number of times equal to the number of images in the temporal series for each region.

9. The method of claim 1, wherein diffusion-sensitization magnetic-field gradient pulses are applied before said spatial-encoding magnetic-field gradients and along at least one spatial axis.

10. The method of claim 9, wherein data is collected corresponding to at least two different values of said diffusion-sensitization magnetic-field gradient pulses, and spatial maps of the apparent diffusivity are calculated from the images corresponding to the different diffusion sensitizations.

11. The method of claim 1, wherein said flip angles for said excitation radio-frequency pulses are all equal.

12. The method of claim 1, wherein said flip angles for said excitation radio-frequency pulses vary between pulse-sequence repetitions and are chosen to yield a specific temporal evolution of the magnetic resonance signals.

13. The method of claim 1, wherein, in addition to the magnetic resonance signals that comprise the image data, a radio-frequency receiver system of the magnetic resonance imaging system is used to receive, for at least one spatial-frequency-space trajectory, a navigator magnetic resonance signal that is used to correct for signal intensity variations between pulse-sequence repetitions.

14. The method of claim 13, wherein the image and navigator magnetic resonance signals are acquired during the same data-sampling period.

15. The method of claim 1, wherein a spatial-frequency-space trajectory measurement method is used to map the actual spatial-frequency-space trajectories generated by said spatial-encoding gradients, and this data is used for at least one of modification of the applied spatial-encoding gradients and correction of the spatial-frequency data during reconstruction.

16. The method of claim 1, wherein said magnetic resonance images are corrected for the effects off-resonance induced phase shifts.

17. The method of claim 1, wherein at least one spatial-frequency-space trajectory for at least one magnetic resonance image corresponding to at least one region within said object is initiated by a trigger signal to synchronize the pulse sequence with at least one of at least one external temporal event and at least one internal temporal event.

18. The method of claim 17, wherein said external and internal events comprise at least one of at least one voluntary action, at least one involuntary action, at least one respiratory cycle and at least one cardiac cycle.

19. The method of claim 1, wherein for all said spatial-frequency-space trajectories the durations of the data-sampling periods are equal.

20. The method of claim 1, wherein for at least one said spatial-frequency-space trajectory the duration of the corresponding data-sampling period is different from that for at least one other spatial-frequency-space trajectory.

21. The method of claim 1, wherein all said radio-frequency pulses are at least one of non-spatially selective, non-chemically selective, spatially selective and chemically selective.

22. The method of claim 1, wherein at least one of the radio-frequency pulses is at least one of spatially selective in one of one, two and three dimensions, chemically selective, and adiabatic.

23. The method of claim 1, wherein, for at least one repetition of the pulse sequence for at least one region within said object, magnetic field gradient-based spoiling of the transverse magnetization is used.

24. The method of claim 1, wherein, for at least one magnetic resonance image for at least one region within said object, radio-frequency spoiling of the transverse magnetization is used.

25. The method of claim 1, wherein a two-dimensional plane of spatial-frequency space is sampled.

26. The method of claim 1, wherein a three-dimensional volume of spatial-frequency space is sampled.

27. The method of claim 26, wherein, for said three-dimensional volume of spatial-frequency space, the third spatial dimension is encoded using conventional phase-encoding gradients.

28. The method of claim 1, wherein said spatial-encoding magnetic-field gradients are configured so as to collect data, following each of at least one of said excitation radio-frequency pulses, along one of a spiral spatial-frequency-space trajectory and a twisted radial spatial-frequency-space trajectory, each trajectory of which is contained in one of two dimensions and three dimensions, and each trajectory of which passes approximately through one of a single point in spatial-frequency space and a single line in spatial-frequency space.

29. The method of claim 28 wherein the single point in spatial-frequency space is about zero spatial frequency.

30. The method of claim 28 wherein the single line in spatial-frequency space passes through about zero spatial frequency.

31. The method of claim 1, wherein said spatial-encoding magnetic-field gradients are configured, for at least one magnetic resonance image for at least one region within said object, so that an incomplete spatial-frequency space data set is acquired based on the desired field of view, spatial resolution and temporal resolution.

32. The method of claim 31, wherein said incomplete spatial-frequency space data set is reconstructed using an appropriate algorithm that accounts for effects of the missing data based on at least one of spatial interpolation, temporal interpolation and Hermitian symmetry.

33. The method of claim 1, wherein, for at least one magnetic resonance image for at least one region within said object, the temporal order in which the spatial-frequency-space data is collected is based on achieving predetermined properties of the corresponding point spread function.

34. The method of claim 3, wherein, for at least one magnetic resonance image for at least one region within said object, the temporal order in which the spatial-frequency-space data is collected is different from that for at least one other magnetic resonance image.

35. The method of claim 3, wherein, for at least one magnetic resonance image for at least one region within said object, the extent of spatial-frequency-space data that is collected is different from that for at least one other magnetic resonance image.

36. A magnetic resonance imaging system for generating a pulse sequence for operating the system for imaging a region of an object, wherein at least a portion of the region contains hyperpolarized noble gas for at least a portion of the time required to apply said pulse sequence, the system comprising:

main magnet system for generating a steady magnetic field in at least a region of the object to be imaged;

gradient magnet system for generating temporary magnetic-field gradients in at least a region of the object to be imaged;

radio-frequency transmitter system for generating radio-frequency pulses in at least a region of the object to be imaged;

radio-frequency receiver system for receiving magnetic resonance signals from at least a region of the object to be imaged;

reconstruction system for reconstructing an image of at least a region of the object from the received magnetic resonance signals; and control system for generating signals controlling the gradient magnet system, the radio-frequency transmitter system, the radio-frequency receiver system, and the reconstruction system, wherein the control system generates signals causing:

a) selecting of spatial-encoding magnetic-field gradients to generate spatial-frequency-space trajectories that:

i) permit the data corresponding to one complete image to be acquired using at most one-half the number of spatial-frequency-space trajectories that would be required for a conventional rectilinear-trajectory gradient-echo pulse sequence with equivalent spatial resolution;

ii) for at least one-half of said spatial-frequency-space trajectories, begin at approximately zero spatial frequency along at least two spatial-frequency axes;

iii) for at least one-half of the spatial-frequency-space trajectory duration, provide motion-induced phase shifts that are less than those corresponding to the frequency-encoding magnetic-field gradient for a conventional rectilinear-trajectory gradient-echo pulse sequence with equivalent spatial resolution;

iv) provide motion-induced phase shifts that vary smoothly along said spatial-frequency-space trajectories;

v) sample approximately the same total extent of spatial-frequency space and approximately the same proportions of low, middle and high spatial frequencies;

vi) provide diffusion-induced signal attenuation that is less than that corresponding to the frequency-encoding magnetic-field gradient for a conventional rectilinear-trajectory gradient-echo pulse sequence with equivalent spatial resolution; and vii) use a data-sampling period that is chosen based on the application, said object and strength of said main magnet system to yield a pre-determined of desired level of magnetic field inhomogeneity-induced image artifacts;

b) selecting of excitation radio-frequency pulse flip angles wherein said flip angles are specifically chosen to use a fraction of the non-equilibrium hyperpolarized magnetization, said fraction determined based on the total number of images to be acquired from said region of said object;

c) generating of magnetic resonance signals from said object by applying radio-frequency pulses to excite nuclear magnetization with said flip angles and by applying said spatial-encoding magnetic-field gradients; and d) reconstructing of a magnetic resonance image from the generated magnetic resonance signals.

37. A magnetic resonance imaging system for generating a pulse sequence for operating the system for imaging a region of an object, wherein at least a portion of the region contains hyperpolarized noble gas for at least a portion of the time required to apply said pulse sequence, the system comprising:

main magnet means for generating a steady magnetic field in at least a region of the object to be imaged;

gradient magnet means for generating temporary magnetic-field gradients in at least a region of the object to be imaged;

radio-frequency transmitter means for generating radio-frequency pulses in at least a region of the object to be imaged;

radio-frequency receiver means for receiving magnetic resonance signals from at least a region of the object to be imaged;

reconstruction means for reconstructing an image of at least a region of the object from the received magnetic resonance signals; and control means for generating signals controlling the gradient magnet means, the radio-frequency transmitter means, the radio-frequency receiver means, and the reconstruction means, wherein the control means generates signals causing:

a) selecting of spatial-encoding magnetic-field gradients to generate spatial-frequency-space trajectories that:
  i) permit the data corresponding to one complete image to be acquired using at most one-half the number of spatial-frequency-space trajectories that would be required for a conventional rectilinear-trajectory gradient-echo pulse sequence with equivalent spatial resolution;
  ii) for at least one-half of said spatial-frequency-space trajectories, begin at approximately zero spatial frequency along at least two spatial-frequency axes;
  iii) for at least one-half of the spatial-frequency-space trajectory duration, provide motion-induced phase shifts that are less than those corresponding to the frequency-encoding magnetic-field gradient for a conventional rectilinear-trajectory gradient-echo pulse sequence with equivalent spatial resolution;
  iv) provide motion-induced phase shifts that vary smoothly along said spatial-frequency-space trajectories;
  v) sample approximately the same total extent of spatial-frequency space and approximately the same proportions of low, middle and high spatial frequencies;
  vi) provide diffusion-induced signal attenuation that is less than that corresponding to the frequency-encoding magnetic-field gradient for a conventional rectilinear-trajectory gradient-echo pulse sequence with equivalent spatial resolution; and
  vii) use a data-sampling period that is chosen based on the application, said object and strength of said main magnet means to yield a pre-determined of desired level of magnetic field inhomogeneity-induced image artifacts;

b) selecting of excitation radio-frequency pulse flip angles wherein said flip angles are specifically chosen to use a fraction of the non-equilibrium hyperpolarized magnetization, said fraction determined based on the total number of images to be acquired from said region of said object;

c) generating of magnetic resonance signals from said object by applying radio-frequency pulses to excite nuclear magnetization with said flip angles and by applying said spatial-encoding magnetic-field gradients; and d) reconstructing of a magnetic resonance image from the generated magnetic resonance signals.

38. A computer readable media carrying encoded program instructions for causing a programmable magnetic resonance imaging system to perform the method of claim 1.

39. A computer program product comprising a computer useable medium having computer program logic for enabling at least one processor in a magnetic resonance imaging apparatus to generate a pulse sequence, said computer program logic comprising:

a) selecting of spatial-encoding magnetic-field gradients to generate spatial-frequency-space trajectories that:
  i) permit the data corresponding to one complete image to be acquired using at most one-half the number of spatial-frequency-space trajectories that would be required for a conventional rectilinear-trajectory gradient-echo pulse sequence with equivalent spatial resolution;
  ii) for at least one-half of said spatial-frequency-space trajectories, begin at approximately zero spatial frequency along at least two spatial-frequency axes;
  iii) for at least one-half of the spatial-frequency-space trajectory duration, provide motion-induced phase shifts that are less than those corresponding to the frequency-encoding magnetic-field gradient for a conventional rectilinear-trajectory gradient-echo pulse sequence with equivalent spatial resolution;
  iv) provide motion-induced phase shifts that vary smoothly along said spatial-frequency-space trajectories;
  v) sample approximately the same total extent of spatial-frequency space and approximately the same proportions of low, middle and high spatial frequencies;
  vi) provide diffusion-induced signal attenuation that is less than that corresponding to the frequency-encoding magnetic-field gradient for a conventional rectilinear-trajectory gradient-echo pulse sequence with equivalent spatial resolution; and
  vii) use a data-sampling period that is chosen based on the application, said object and strength of a main magnet system of said magnetic resonance imaging system to yield a pre-determined or desired level of magnetic field inhomogeneity-induced image artifacts;

b) selecting of excitation radio-frequency pulse flip angles wherein said flip angles are specifically chosen to use a fraction of the non-equilibrium hyperpolarized magnetization, said fraction determined based on the total number of images to be acquired from said region of said object;

c) generating of magnetic resonance signals from said object by applying radio-frequency pulses to excite nuclear magnetization with said flip angles and by applying said spatial-encoding magnetic-field gradients; and d) reconstructing of a magnetic resonance image from the generated magnetic resonance signals.

* * * * *